US006528986B2

(12) United States Patent
Ballard

(10) Patent No.: US 6,528,986 B2
(45) Date of Patent: Mar. 4, 2003

(54) INNER COMPONENT BOARD ASSEMBLY FOR AN ELECTRIC UTILITY METER

(75) Inventor: Henry Ballard, Easley, SC (US)

(73) Assignee: Schlumberger Resource Management Services, Inc., Norcross, GA (US)

( * ) Notice: Subject to any disclaimer, the term of this patent is extended or adjusted under 35 U.S.C. 154(b) by 0 days.

(21) Appl. No.: 09/751,316

(22) Filed: Dec. 28, 2000

(65) Prior Publication Data

US 2002/0084778 A1 Jul. 4, 2002

(51) Int. Cl.[7] .......................... G01R 11/32; H02B 1/00; H05K 3/20
(52) U.S. Cl. .................... 324/158.1; 324/142; 361/659; 29/831
(58) Field of Search ............................... 361/659, 664, 361/665, 666, 667, 736, 796, 728; 439/517; 324/158.1, 142; 174/52.1; 29/829–832

(56) References Cited

U.S. PATENT DOCUMENTS

| | | | |
|---|---|---|---|
| 4,368,943 A | * 1/1983 | Davis et al. ................. | 439/517 |
| 4,404,522 A | * 9/1983 | Pucciarello ................. | 324/114 |
| 4,491,789 A | 1/1985 | Benbow | |
| 4,744,004 A | 5/1988 | Hammond | |
| 4,783,623 A | 11/1988 | Edwards et al. | |
| 4,791,362 A | * 12/1988 | Philpot ....................... | 324/142 |
| 4,792,677 A | 12/1988 | Edwards et al. | |
| 4,977,368 A | * 12/1990 | Munday et al. ............. | 324/142 |
| 5,001,420 A | 3/1991 | Germer et al. | |
| 5,270,639 A | 12/1993 | Moore | |
| 5,555,508 A | 9/1996 | Munday et al. | |
| 5,588,874 A | 12/1996 | Pruehs et al. | |
| 5,966,010 A | * 10/1999 | Loy et al. ................... | 324/142 |
| 5,994,892 A | 11/1999 | Turino et al. | |

* cited by examiner

Primary Examiner—Kamand Cuneo
Assistant Examiner—Russell M. Kobert
(74) Attorney, Agent, or Firm—Dority & Manning; Leonard W. Pojunas, Jr. Esq.

(57) ABSTRACT

An improved inner component board arrangement and corresponding assembly for an electric utility meter is disclosed. The enhanced structure offers comprehensive stability and protection of circuit boards and corresponding electronic components within an integrated meter assembly. The arrangement generally includes at least two printed circuit boards housed in a casing structure. Various projections extend from the casing structure to effectively position and secure the printed circuit boards within an overall component assembly. Specific projections employed for positioning the circuit boards include tapered locator pins and respective mating holes as well as key projections that interconnect with slots located in selected circuit boards. Snaps project from casing components to securely constrain the circuit boards within the component assembly. Established orientation of various components and projections significantly facilitates the meter assembly process.

60 Claims, 21 Drawing Sheets

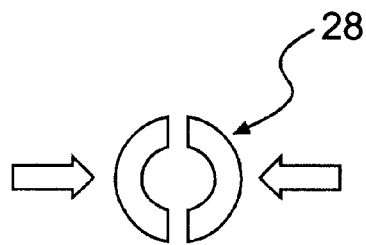
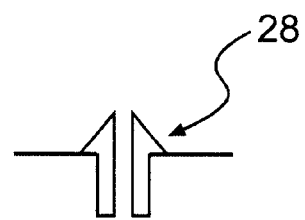
FIG. 2A
PRIOR ART
FIG. 2B
PRIOR ART
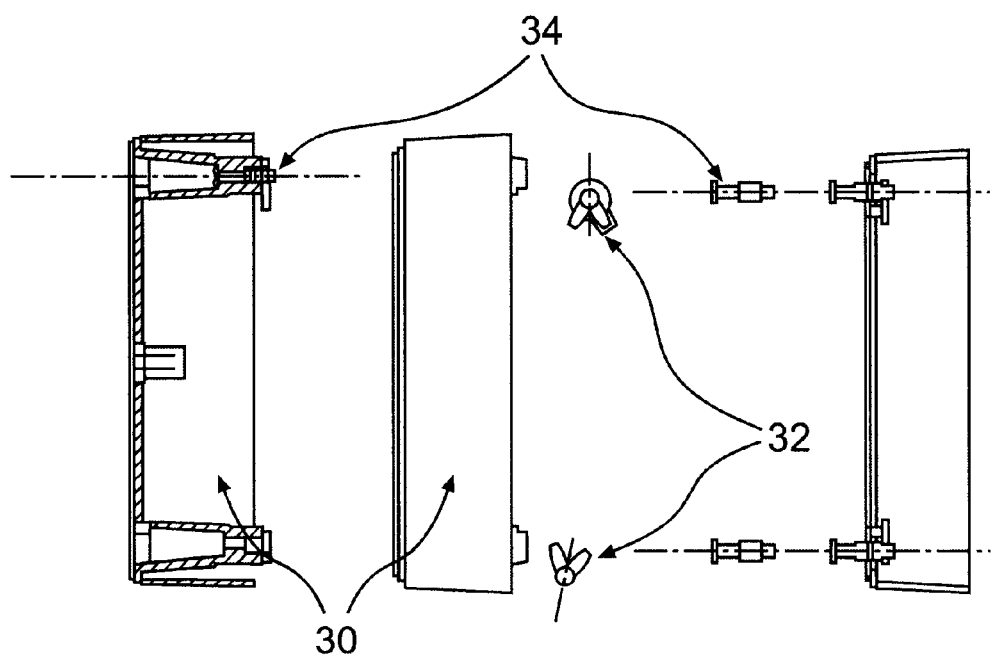
FIG. 3
PRIOR ART

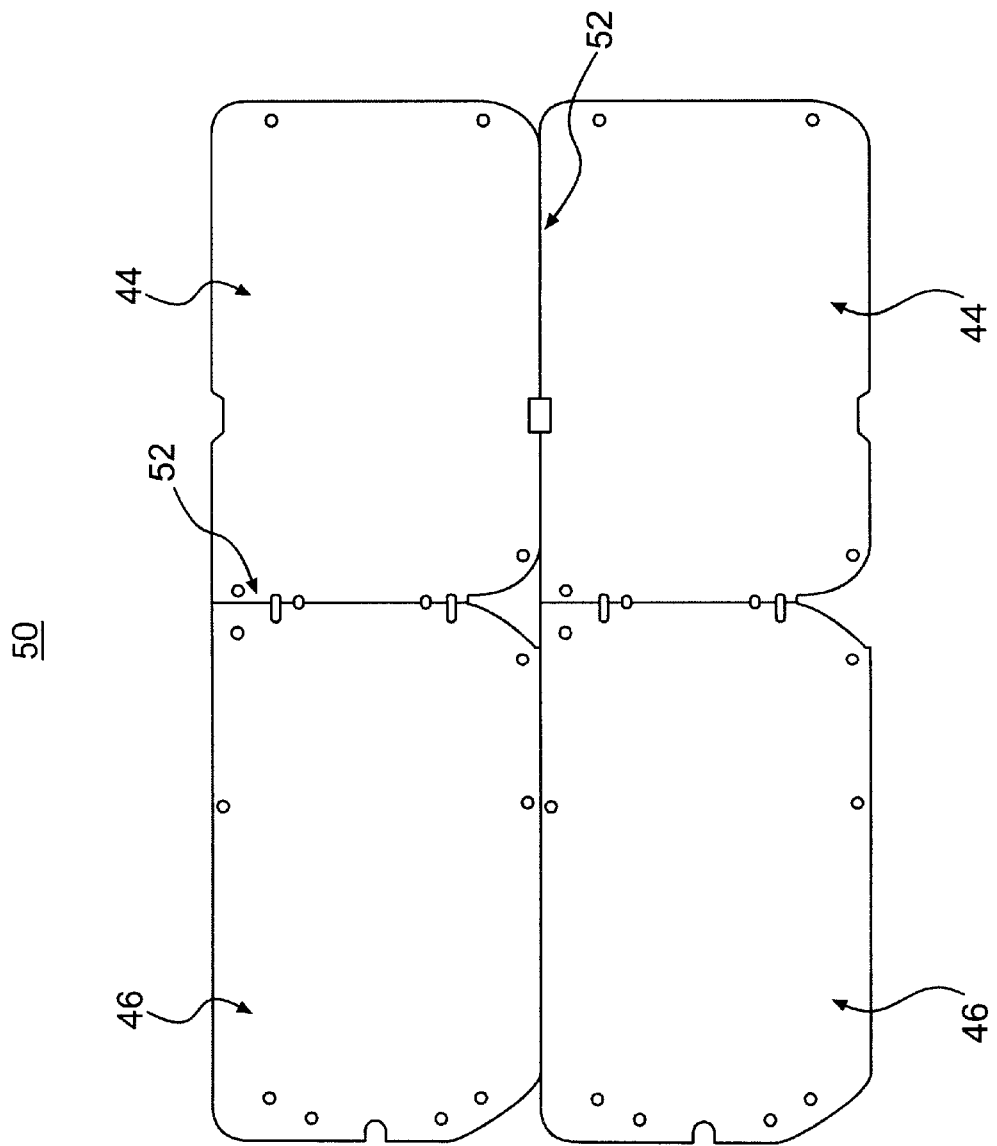

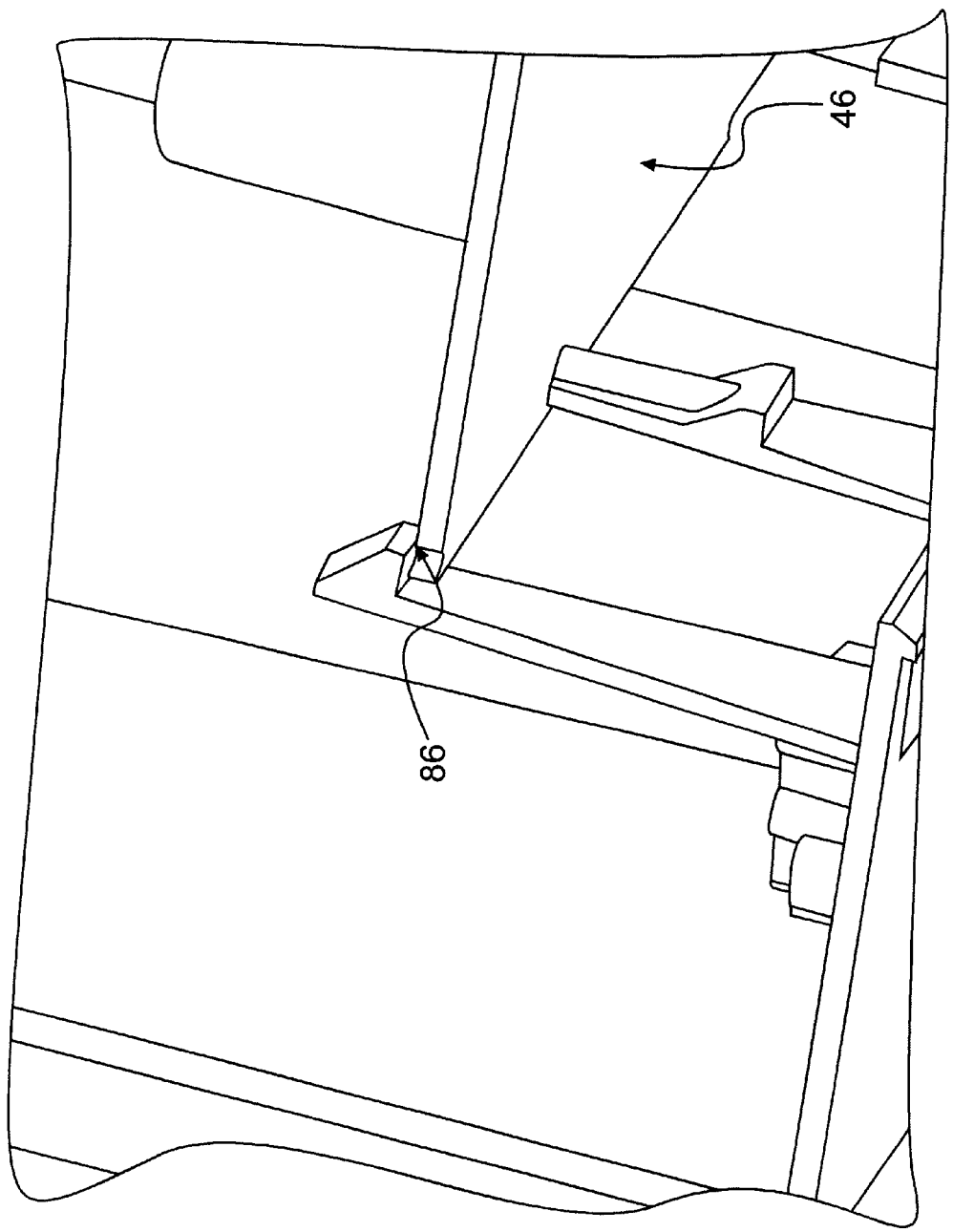

INNER COMPONENT BOARD ASSEMBLY FOR AN ELECTRIC UTILITY METER

BACKGROUND OF THE INVENTION

The present invention generally concerns improved structure and resulting assembly of circuit boards and casing structures employed in electric utility meters, and more particularly, concerns an integrated meter casing assembly with unique means for positioning and protecting printed circuit boards within an electric utility meter casing combination. The subject invention concerns both apparatuses and corresponding processes for assembly in such areas, including a focus on both the combinatory process of pertinent mechanical and electrical metering components as well as the manufacturing design of selected composite assemblies.

There are a wide variety of utilized designs that offer means for housing and protecting the electronic component boards utilized in an electric utility meter. Specific designs focus on the orientation of the circuit boards within an electric utility meter. Other designs emphasize ways to effectively retain these circuit boards and other components within the overall meter assembly. The ease of assembling a respective design is also an imperative feature in today's competitive manufacturing atmosphere. Any number of such design focuses may be employed depending on specific applications of such a meter, including the commercial environment in which a meter is applied.

It is typically ideal to construct a meter casing that is easily assembled as well as disassembled to ensure ready access to internal components of an electric meter, especially to printed circuit boards. Potential accessibility of a meter once it has an established location in the field is aided by several design characteristics.

It is desired to utilize a minimum number of parts needed to accomplish full functionality of an electric utility meter casing. It may also be ideal to exclude component parts in a meter casing assembly such as screws or clips, since such parts may be difficult to remove and could easily be misplaced. A simple and convenient removal process would ensure that casing components and electronic boards are not damaged and also that loose mechanical parts are not lost in the field.

Another inherent goal of an electric utility meter casing is to provide adequate protection of its internal components. Such protection is achieved through design and utilization of various meter casing components, and the stability of such casing components is essential to ensuring proper protection. A utility meter may endure significant mechanical loads from impact with foreign is objects, shock loads from transportation and installation, or additional stress from diverse environmental conditions. It is thus ideal to provide a fully stabilized meter casing that ensures safeguarded protection of a meter's components.

Additional concerns include not only protecting the utility meter, but protecting those exposed to such meters. Functionality should provide both the meterman who potentially services a meter as well as the customer who potentially uses a meter with adequate protection from electrical shock. Designs should provide ease of component manufacturing and assembly. Finally, it is desired that all design goals are achieved in a safe, reliable and cost-effective manner.

There are known meter design which incorporate a predefined arrangement of internal meter components. Exemplary designs include two printed circuit boards that are positioned and secured within an electric utility meter with the use of cardholders, rods and snaps. Screws are also used in the assembly process, which may pose the risk of misplacing loose parts. The two printed circuit boards are positioned on top of one another in a circuit board cover. This entire assemblage is then housed by an additional outer cover. Thus, another drawback of the design is difficult accessibility of the lower circuit board. In order to reach this lower board, the outer cover and circuit board cover must each be removed, each of multiple cardholder snaps must be compressed together and released, and the top circuit board must also be removed. This makes for a troublesome and often time-consuming process that field technicians or metermen may be involved in.

Present meter designs are also known that include pancake-like casing components that house the electronic circuit boards of an electric utility meter. Each "pancake" houses a single electronic circuit board and stacks upon the pancake below it. In each pancake, there is one circuit board that is fastened in with screws. Additionally, each pancake is held in place by a rotating latch, which is operated by another screw. Thus, in order to access any of the lower circuit boards (or pancakes), each pancake would need to be unlatched and removed. This characteristic makes for a difficult disassembly process and also incorporates undesired connective parts.

Other utility meter applications use snaps to connect a meter's circular inner modules together. Printed circuit boards are positioned inside the inner modules and are nearly the same diameter as the inner modules of some present commercial or industrial meters. The boards are typically positioned and held in the inner modules with a plurality of stepped posts and snaps along the perimeter of the board. In some instances, snap-in standoffs are used to maintain board spacing. Screws are often further used to secure a circuit board to an inner cover.

Another known meter casing design utilizes a lower inner cover and an Upper inner cover. Circuit boards are either fastened to the uppermost inner cover with screws or sandwiched between the upper and lower covers that are in turn fastened together with screws.

While various aspects and alternative inner component assemblies are known in the electric utility meter field, no one design has emerged that generally encompasses all of the above-referenced ideal electric utility meter characteristics and corresponding assembly procedure.

SUMMARY OF THE INVENTION

In view of the discussed drawbacks and shortcomings encountered in the prior art, an improved inner component assembly for an electric utility meter has been developed. Thus, broadly speaking, a general object of the invention is improved structure and corresponding assembly of electronic circuit boards within an electric utility meter casing.

It is another general object of certain embodiments of the present invention to provide an electric utility meter inner component assembly that is easily put together and consequently readily disassembled in the event that a meter casing need to be removed for access to or repair of specific electronic components of a meter.

It is yet another general object that various embodiments of the present invention may provide an electric meter inner component assembly that incorporates a minimum number of parts to accomplish fall functionality.

It is a further general object that selected embodiments of the present invention provide an electric utility meter assembly that does not involve loose parts that are easily lost or misplaced, such as screws, clips or stand-offs, thereby providing field technicians with easier access to a meter.

It is a principle object of the present invention to provide an inner component assembly for an electric utility meter that can effectively position and retain at least two printed circuit boards within its assembly.

It is another principal object of various embodiments of the present invention to provide an electric utility meter casing including inner covers that are used to house and protect various electronic components of an electric utility meter and an outer cover to enclose and stabilize the inner covers.

A further principal object of the present invention is to incorporate projections that extend from selected inner covers of an electric utility meter to position and secure printed circuit boards within an inner component assembly. Selected embodiments of the invention may incorporate specific projections, including locator pins, snaps or keys that selectively interconnect with openings and slots located on the circuit boards themselves.

Additional objects are incorporated into embodiments of the subject invention which combine with above-referenced objects to further position, retain and protect electronic circuit boards and other electronic components within an electric utility meter assembly.

In the context of improved component structures and corresponding methodology, it is another object of the disclosed assembly to provide integrated structures in which multiple meter parts are constructed in unified combinatory configurations. Manufacture of these structures, which combine several elements that are removable from one another, aids the assembly process of an electric utility meter. The assembly process is also facilitated by a sequentially defined procedure to position and secure printed circuit boards within an electric utility meter assembly.

Additional objects and advantages of the invention are set forth in, or will be apparent to those of ordinary skill in the art from, the detailed description herein. Also, it should be further appreciated that modifications and variations to the specifically illustrated, referred and discussed features and steps hereof may be practiced in various embodiments and uses of this invention without departing from the spirit and scope thereof, by virtue of present reference thereto. Such variations may include, but are not limited to, substitution of equivalent means and features or steps for those illustrated, referenced or discussed, and the functional, operational or positional reversal of various parts, features, steps or the like.

Still further, it is to be understood that different embodiments, as well as different presently preferred embodiments, of this invention may include various combinations or configurations of presently disclosed features, steps or elements, or their equivalents (including combinations of features or steps or configurations thereof not expressly shown in the figures or stated in the detailed description). One exemplary such embodiment of the present invention relates to an electronic component board assembly for an electric utility meter. Such arrangement may comprise a first and second electronic component board, a means for connecting these circuit boards, an inner casing, and first and second pluralities of projections.

More preferably, both first and second electronic component boards include corresponding first and second pluralities of openings for accommodating interconnection with additional elements of a component board assembly. An inner casing effectively houses and protects both electronic component boards. Both first and second pluralities of projections preferably extend from this inner casing and interconnect with selected of the pluralities of openings. Ideally, one set of projections includes tapered locator pins to specifically assist with positioning the circuit boards, while the other set of projections includes keys and snaps to specifically aid in securing and capturing the boards within an electric utility meter assembly.

Another exemplary embodiment of the present invention concerns an electric utility meter that may variously comprise a baseplate, first and second inner covers, first, second and third printed wire boards, a connective element, a plurality of board connection projections, a plurality of board securement projections, a plurality of inner cover projections, and an outer cover.

Ideally, the first inner cover houses and protects electronic components of an electric utility meter and is connected to the baseplate. Each of the three printed wire boards includes respective pluralities of openings for accommodating interconnection with additional parts of an electric utility meter. A connective element preferably links the first and second printed wire boards together, and the second inner cover houses and protects these two wire boards. The board connection projections ideally include tapered pins for interconnecting with selected of the pluralities of openings. The board securement projections preferably include both snaps for providing snap-fit connections between printed wire boards and the second inner cover as well as keys for securing with selected of the printed wire board openings. The inner cover projections should help to interconnect the first and second covers while providing additional stability to the integrated meter structure. An outer cover ideally encloses both inner covers, and mutually interconnects with at least one of these inner covers.

Yet another exemplary embodiment of the present invention involves an electric utility meter that includes various combinations of the foregoing casing features, further including various electronic components for use in an electric utility meter. Ideally such electronic components would include a combination of electronic circuit boards and current sensing elements.

Additional exemplary embodiments involve integrated manufactured structures including a lower inner cover assembly and a component board baseplate assembly that are constructed in an effort to ease the process of assembling electric utility meters.

An exemplary lower inner cover assembly includes a lower inner cover, a plurality of rivets and an additional structure. The lower inner cover includes a plurality of openings and ideally houses and protects certain electronic components of an electric utility meter. The rivets and hanger are ideally removably connected to the lower inner cover, so that they can be disconnected and subsequently utilized for their respective assembly purposes. Preferably the rivets are used in conjunction with the various lower inner cover openings to interconnect the lower inner cover with a baseplate.

An exemplary component board baseplate assembly includes a plurality of component board baseplates, a plurality of scorelines, and a plurality of openings. More preferably, the component board baseplates are for use in at least two electric utility meter assemblies and the plurality of scorelines defines distinct baseplates, providing a separation where baseplates can be broken apart from adjacent baseplates of the assembly. The openings are included on the baseplate for ideally interconnecting with additional elements of a meter assembly.

Additional embodiments of the subject invention, not necessarily expressed in this summarized section, may include and incorporate various mixtures and combinations of aspects of features referenced in the summarized objectives above, and/or other features as otherwise expressed in this application.

The present invention equally concerns various exemplary corresponding methodologies for manufacture and assemblage of all of the herein referenced meter embodiments.

Those of ordinary skill in the art will better appreciate the features and aspects of such embodiments, and others, upon review of the remainder of the specification.

BRIEF DESCRIPTION OF THE DRAWINGS

A full and enabling disclosure of various embodiments of the present invention, including the best mode thereof, directed to one of ordinary skill in the art, is set forth in the specification, which makes reference to the appended figures, in which:

FIG. 2A depicts a top view of an exemplary snap closure utilized in a known electric utility meter;

FIG. 2B depicts a side view of an exemplary snap closure utilized in a known electric utility meter;

FIG. 3 depicts an exploded side view of an exemplary electric utility meter assembly, including encased circuit boards and other selected meter components in a known orientation and secured with a known means;

FIG. 5 illustrates a top view of an unpopulated pallet of exemplary circuit boards, including four distinct and separable boards excluding any electronic components thereon;

FIG. 18 illustrates an exemplary safeguarded securing means for inner components of an electric utility meter assembly;

Figure 1:
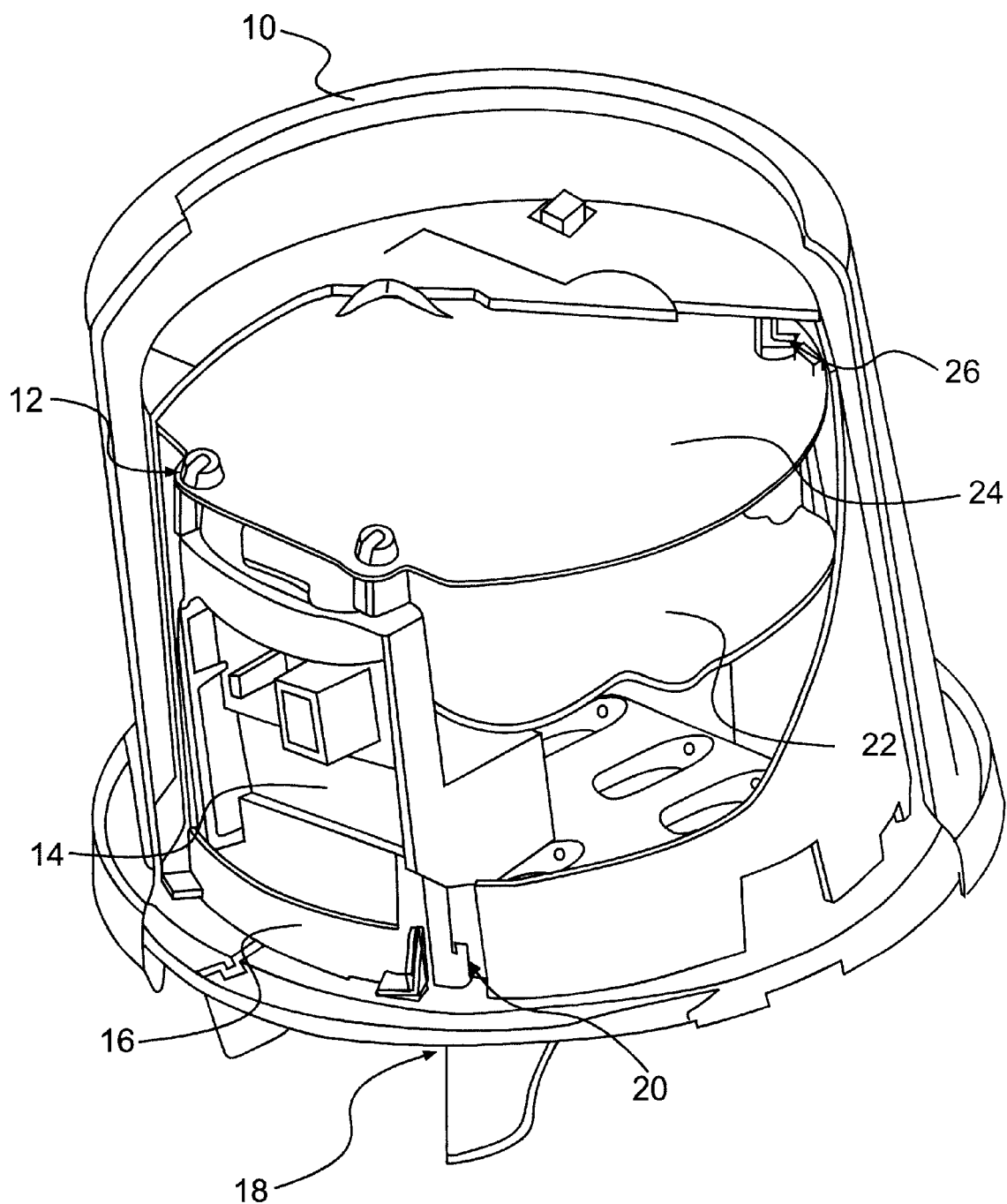
FIG. 1 depicts a cutaway view of a known electric utility meter assembly including a known means for securing printed circuit boards within a meter assembly.

Repeat use of reference characters throughout the present specification and appended drawings is intended to represent same or analogous features or elements of the invention.

It is characteristic of several of the appended drawings that certain components are not shown in specific views of the subject invention. Exclusion of specific components is applied for the sake of clarity, enabling an appropriate understanding of particular interconnections among selected elements of certain embodiments of the present invention.

DETAILED DESCRIPTION OF THE DRAWINGS

Figure 4:
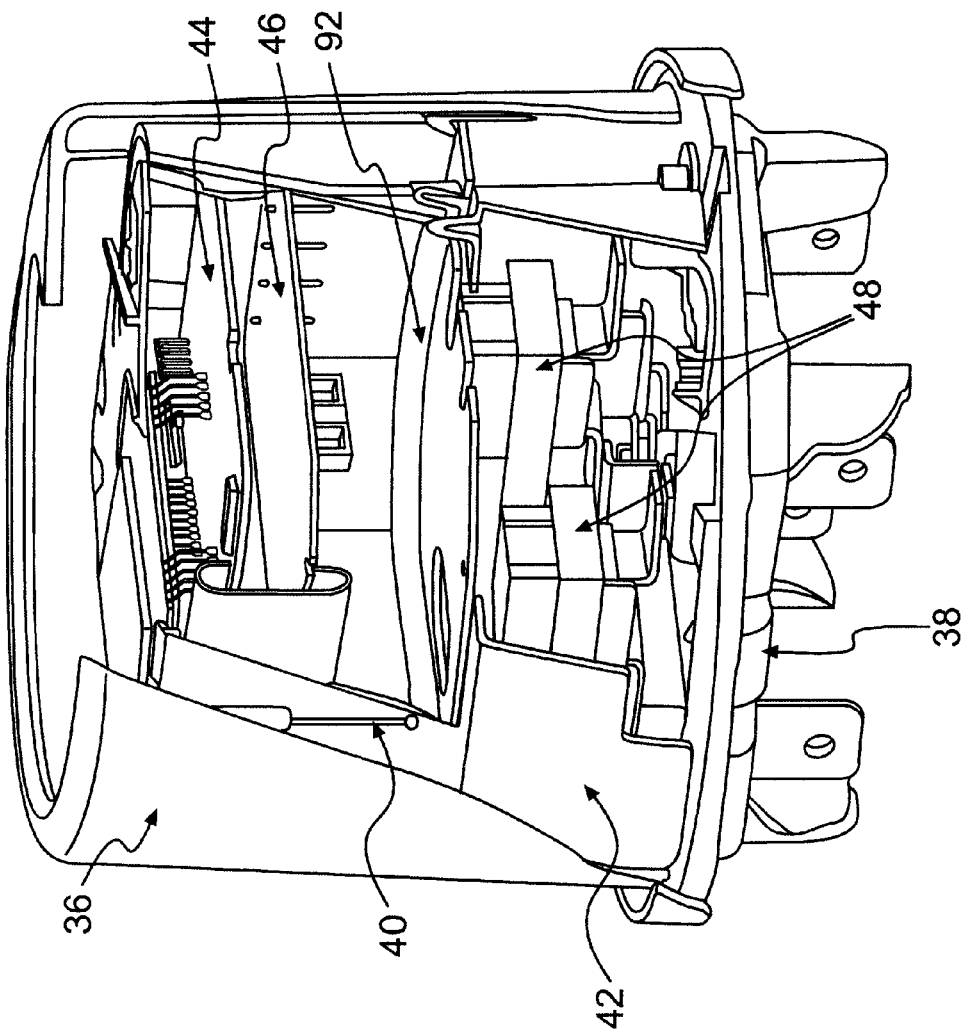
FIG. 4 illustrates a generally front cutaway view of an electric utility meter assembly, encompassing one exemplary embodiment of the present invention and including an inner component assembly of internal casing components and printed circuit boards.
Figure 10:
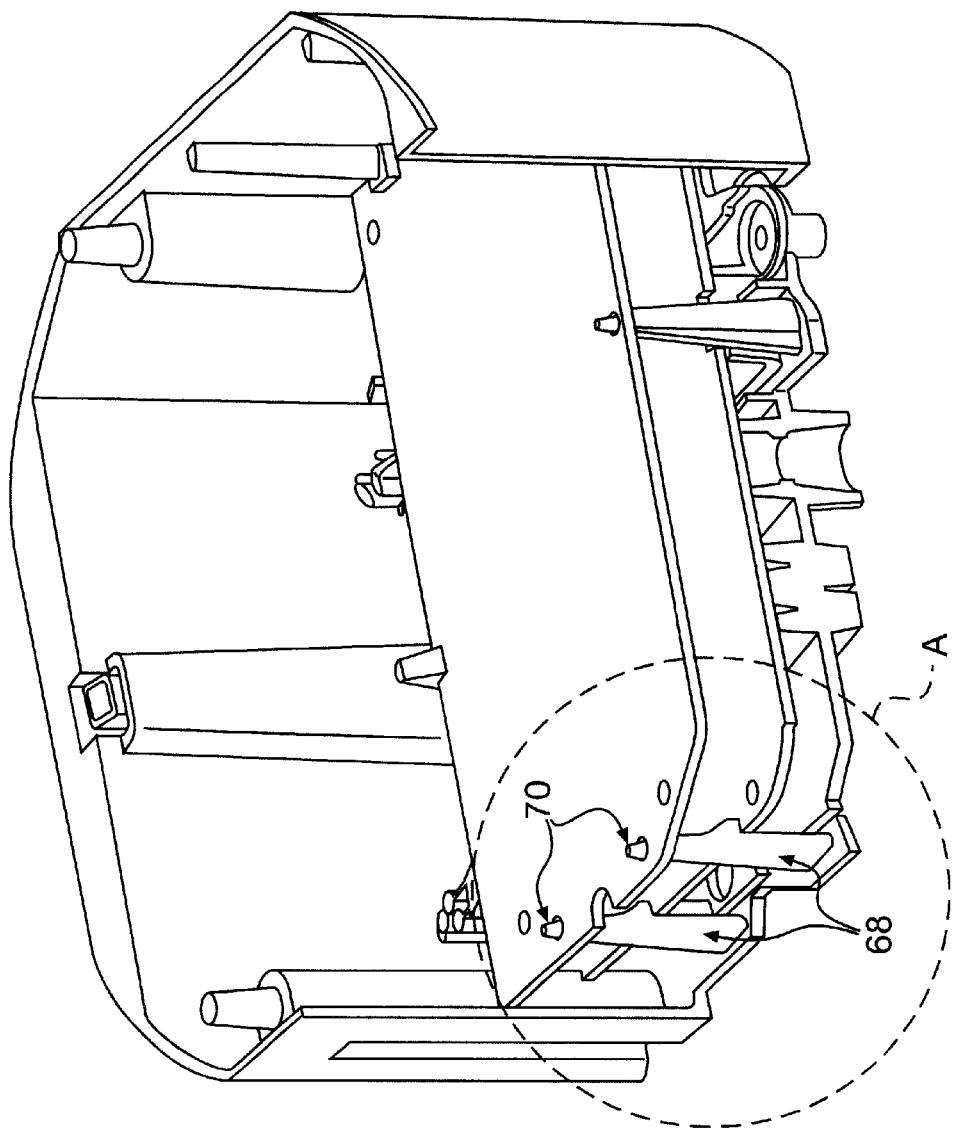
FIG. 10 illustrates a cutaway view, with slight top perspective of exemplary circuit boards within an inner cover, encompassing an additional exemplary embodiment of the subject invention and focusing on a snap-tower securing arrangement.

As discussed in the summary of the invention, the present invention is particularly concerned with the inner component assembly of an electric utility meter. Known component assemblies have incorporated varied combinations of components to offer desired assembly characteristics. There are several specific characteristics of such previous designs that are disclosed in FIGS. 1 through 3 and are described in detail herein. FIG. 4 illustrates an exemplary embodiment of the present invention, including printed circuit boards and various general casing components. These casing components include at least two inner covers, one of which houses the printed circuit boards, an outer cover and a baseplate. FIG. 10 illustrates an additional embodiment of the subject invention, including two printed circuit boards positioned and secured into a casing component.

Figure 21:
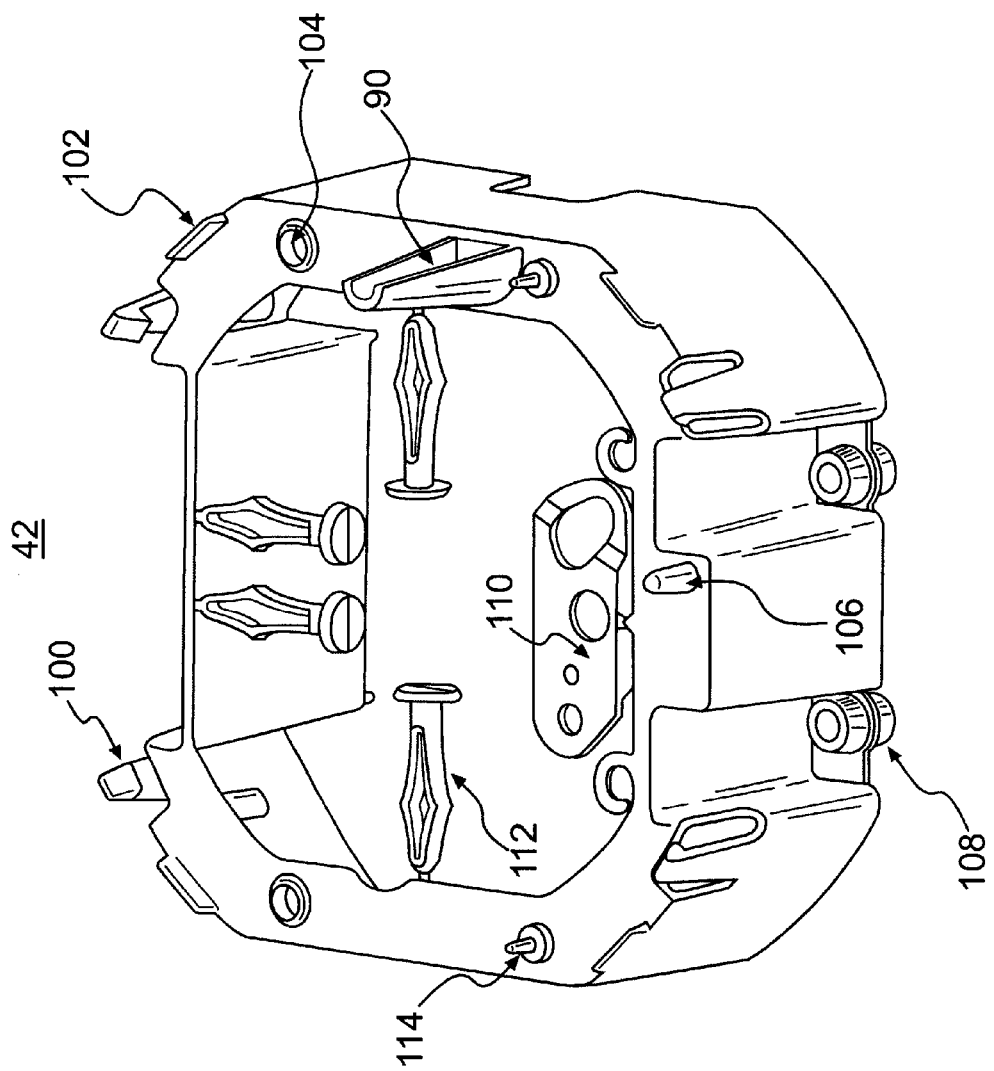
FIG. 21 illustrates an exemplary lower inner cover including additional manufactured appendages.

Two manufactured component assemblies are highlighted as characteristic features of certain embodiments of the subject invention. FIG. 5 depicts an exemplary embodiment of the first of these assemblies, and illustrates an unpopulated component board pallet. An exemplary lower inner cover assembly that is manufactured for use in the subject invention is illustrated in FIG. 21. Additional aspects and detailed features of the invention are illustrated in others of the included drawings.

It should be noted that each of the exemplary embodiments should not insinuate limitations of the invention. Features illustrated or described as part of one embodiment can be used on another embodiment to yield a still further embodiment. Additionally, certain features may be interchanged with similar devices or features not mentioned yet which perform the same or similar function.

Reference will now be made in detail to the presently preferred embodiments of the invention. Referring to the drawings, FIGS. 1 and 2 illustrate exemplary components utilized in a known electric utility meter embodiment. FIG. 1 illustrates an exemplary electric utility meter assembly that facilitates the securement of a maximum of two printed circuit boards. This assembly specifically includes two circuit boards, a display board 24 and an option board 22. The lower, option board 22 sits mid-way between two cardholders 14 extending from the baseplate 18 of the meter. Each cardholder 14 has two hollow, slotted posts protruding upward forming snaps 12. The main display board 24 has four holes through which ends of the posts are inserted and snapped into place. Next, the circuit board cover 16 is positioned over the boards and cardholders 14 and rods are subsequently inserted into the snaps 12 locking the boards into a secure position. The circuit board cover 16 is compressed at its base to form an oblong shape so that it can be fitted over two catches 20 on the base of each cardholder 14. In the assembly process, the cardholders 14 are affixed to the baseplate 18 with screws while holding the option board 22 between the cardholders 14. Next, the display board 24 is lowered over the cardholder snaps 12, which locks the option board 22 in place. Subsequently, the circuit board cover 16 is placed over the circuit boards and the cardholders 14 with their rods inserted into the cardholder snaps 12 (which secures the display board 26). An outer cover 10 is deflected sufficiently to clear the cardholder catches 20 located near the base 18. There is a circuit board cover pin 26 in one of the cardholder snaps 12 that aids in positioning the circuit board cover 16 over the cardholder assembly. Once the outer cover 10 is assembled, the circuit board cover 16 cannot be deflected sufficiently to release from the cardholder catches 20. Note that the outer cover 10 does not directly touch or support the inner board cover 16.

FIGS. 2A and 2B illustrate exemplary snap closures 28 for an electric utility meter assembly such as that illustrated in FIG. 1. These snap closures 30 provide a removable connection between the circuit board cover 16 and the cardholder 14. In order to remove the top circuit board, the outer cover 10 and circuit board cover 16 are removed and each snap 12 on the cardholder 14 has to be compressed together before the board can be released from the snap 28.

FIG. 3 illustrates exemplary components utilized in an additional known electric utility meter embodiment. FIG. 3 depicts an electric utility meter assembly utilizing a pancake-like assembly. Each pancake 30 houses one electronic circuit board and stacks upon the pancake below it. Each pancake 30 must be held in place by a rotating latch 32 that is operated by a screw 34. Thus, in order to access any of the lower boards, or pancakes, each pancake 30 would need to be unlatched and removed.

FIG. 4 illustrates an exemplary embodiment of the subject invention, including printed circuit boards and enclosure within various casing components. Two inner covers house and protect various electronic components that may be included in an electric utility meter. More specifically, a lower inner cover 42 houses current sensing elements 48 and an upper inner cover 40 houses printed circuit boards. These circuit boards include a register board 44 and a power supply board 46 that are oriented parallel with one another. Various projection elements generally extend from upper inner cover 40 to secure the two printed circuit boards in place. The upper inner cover 40 is secured to the lower inner cover 42, while possibly sandwiching an option board 92 in between the two inner covers. (An option board may or may not be included in preferred embodiments of the present invention.) The lower inner cover 42 is in turn secured to a baseplate 38. The inner covers are both enclosed by and interconnected with an outer cover 36.

FIG. 5 illustrates an unpopulated pallet 50 of exemplary circuit boards. Two register boards 44 and two power supply boards 46 are manufactured in a pallet 50, providing enough basic circuit boards for use in two electric utility meter assemblies. In order to form the actual printed circuit boards, the pallet 50 makes a single pass through part placement and soldering, at which time predetermined electronic components are fixed to the pallet. After soldering, the pallet 50 is tested for correct component placement and operation. The pallet 50 is then passed to a functional test station where any light-emitting diodes (LED's) and at least one liquid crystal display (LCD) are programmed accordingly and subsequently tested to verify proper component operation. This process facilitates the testing of two fully operational electronic meters.

Figure 6A:
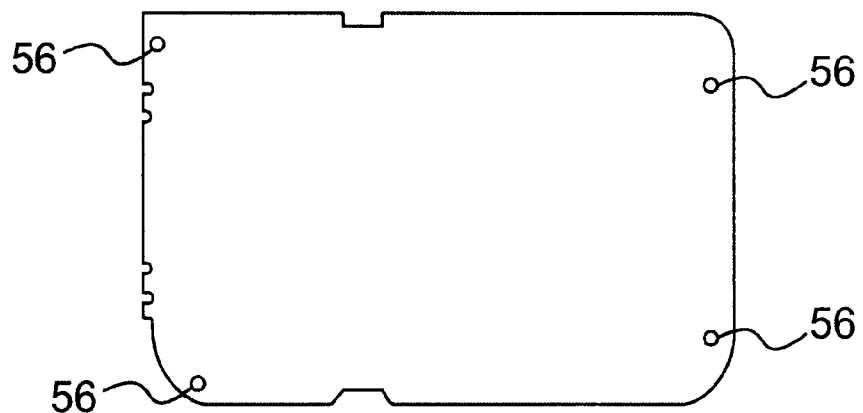
FIGS. 6A and 6B illustrate two exemplary unpopulated circuit boards, including various openings therewith to aid in securing to additional components of an electric utility meter.
Figure 6B:
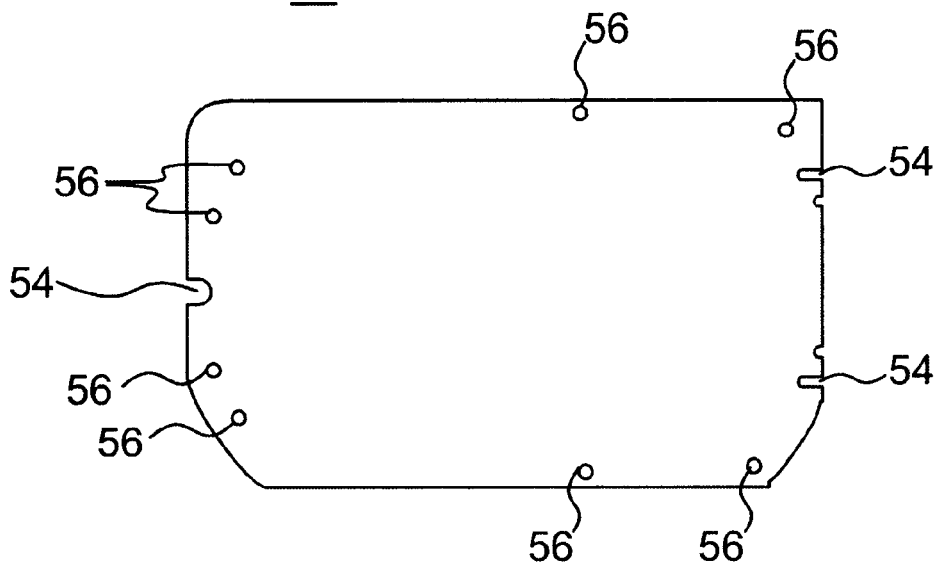

After populating the component board pallet 50 and proceeding through the additional assembly steps described above, the pallet is separated into constituent circuit boards. These boards are produced by breaking the pallet 50 along indicated scorelines 52. Breaking the pallet 50 along the scorelines 52 results in four printed circuit boards. FIG. 6A shows an unpopulated register board 44 and FIG. 6B shows an unpopulated power supply board. Both printed circuit boards include respective pluralities of locator holes 56 that are used to interconnect with additional components of an electric utility meter. The power supply board of FIG. 6B includes multiple slots 54 that are used to help secure the board within the assembly. Two slots 54 are located on one of the shorter sides of the quasi-rectangular power supply board 46 and an additional slot 54 is located on the short side directly opposite the first two slots.

Figure 7:
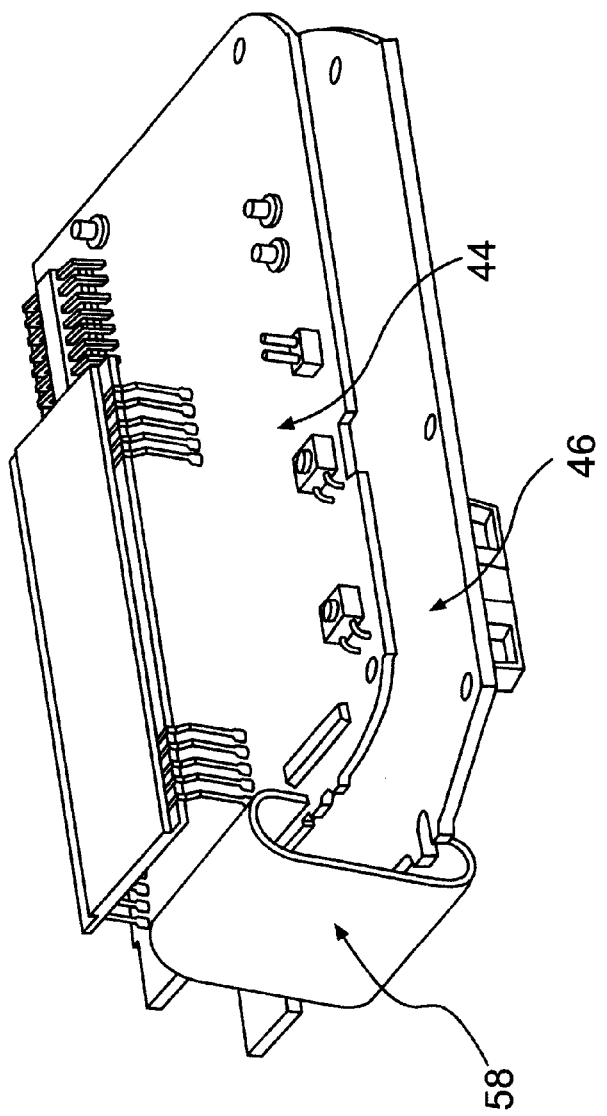
FIG. 7 illustrates an exemplary combination of two printed circuit boards for use in a utility meter linked together with a suitable connection.

A combination of one register board 44 and one power supply board 46 is utilized in each electric utility meter assembly. These two boards are provided in a circuit board pair that is formed by a connection across the common scoreline. This is accomplished by using a flexstrip component 58 that consists of flexible, insulated, parallel conductors. This connector 58 is placed and soldered along with the other electronic components, as previously described. After component testing, the pallet 50 is broken apart at the scorelines 52 into two circuit board pairs where each pair includes one register board 44 and one power supply board 46 connected by a flexible conductor 58 as shown in FIG. 7. This attachment defines a hinge-type movement of the power supply board 46 with respect to the register board 44. This pair of boards is housed in the upper inner cover 40 of a meter assembly as seen in the cutaway view of FIG. 4. An option board 92 may also be used in the meter assembly to provide additional metering or communications functions. Such a board would also be housed in the upper inner cover 40, and ultimately sandwiched between upper 40 and lower 42 inner covers.

Figure 8:
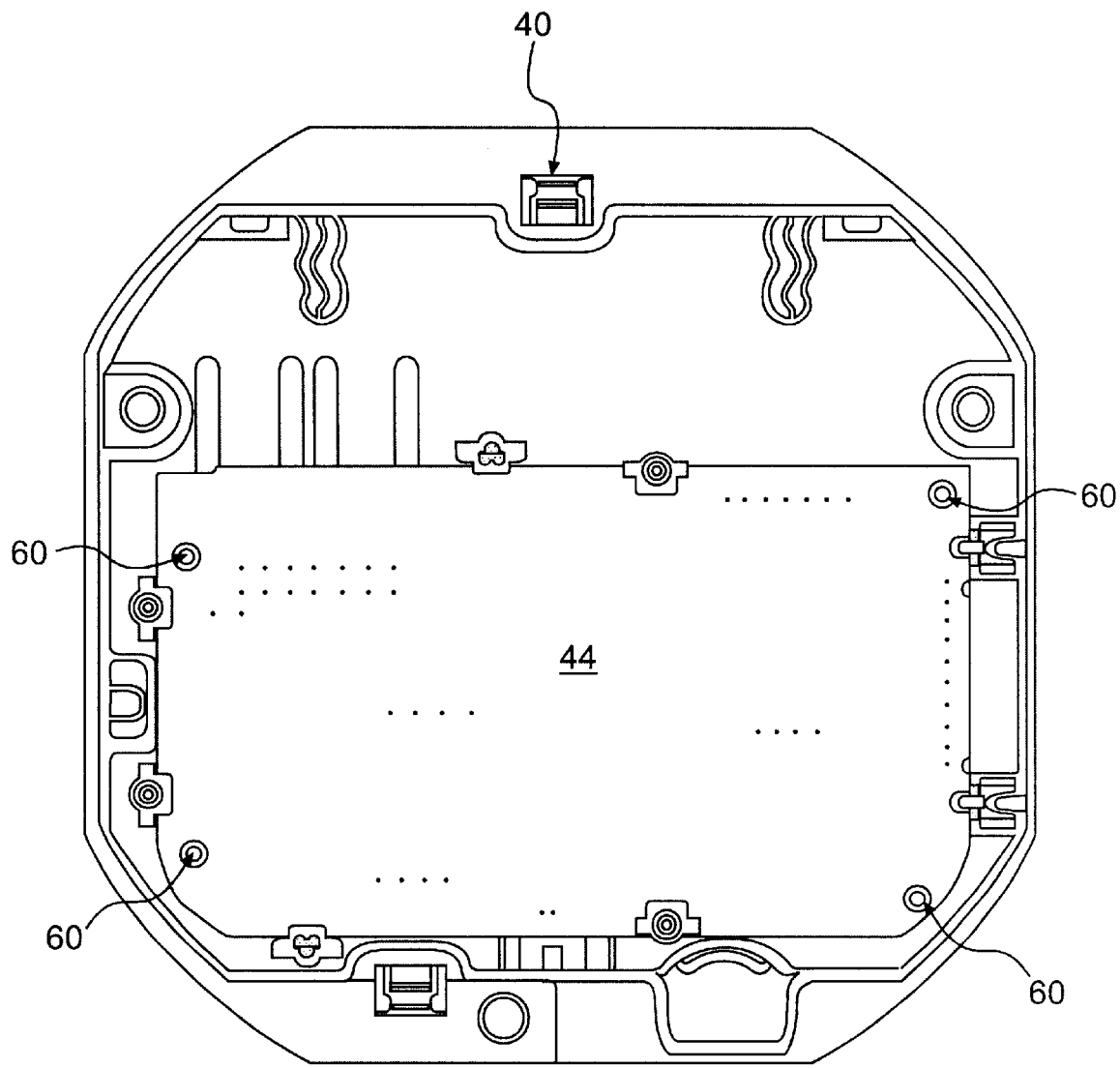
FIG. 8 illustrates a bottom view of an exemplary first circuit board assembled into an exemplary inner casing component.
Figure 9A:
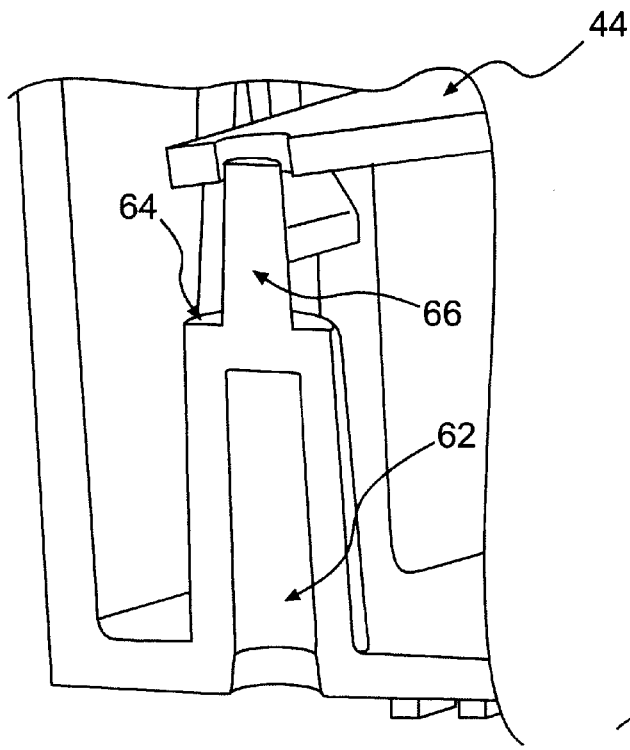
FIGS. 9A and 9B illustrate generally side views of an exemplary mounting post arrangement for securing printed circuit boards within an electric utility meter.
Figure 9B:
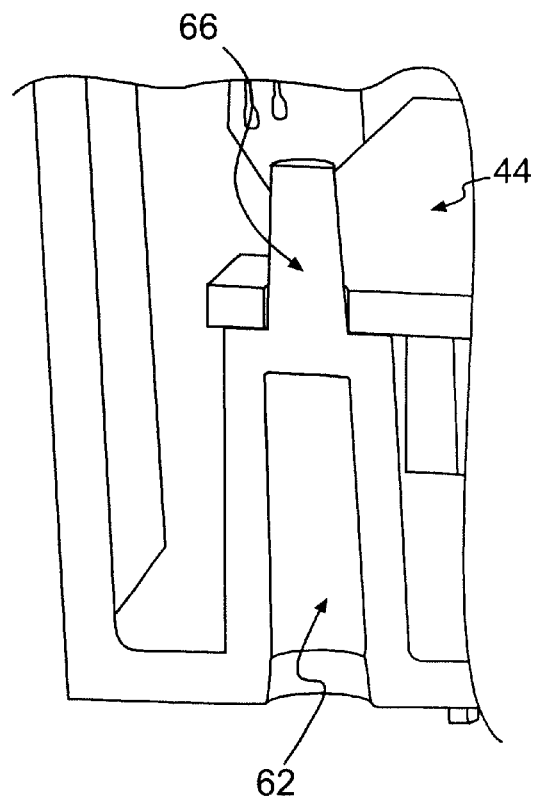

The register board 44 is the first circuit board of the board pair to be positioned in the upper inner cover 40. The register board 44 is quasi-rectangular in shape and smaller in size than the actual cover assembly. At approximately each corner of the board 44, four locator hole and pin combinations 60 help to position the register board 44 within the upper inner cover 40, as seen in FIG. 8. The locator pins 66 that mate with openings 56 in the register board 44 are located at the end of mounting posts 62 that extend from the inside of the upper inner cover 40. The locator pins 66 are tapered as seen in FIG. 9A, providing a "lead in" which facilitates locating and orienting the board 44 as it is initially placed into the inner cover 40. Each mounting post 62 also includes a mounting post flat 64, as seen in FIGS. 9A and 9B, that serves to maintain the register board 44 at a prescribed distance from the inner cover 40.

The locator pins 66 described above are long relative to their overall diameter and the leading diameter of the pins 66 is small relative to the locator holes 56 found in the register board 44. Thus, a large variance in orientation or location can be accommodated in the initial assembly. However, as a board travels axially with respect to the pins 66, the tapered shape forces the register board 44 into its proper position. (See FIG. 9B). The combined effect of these pins 66 and the flats 64 of each of the four mounting posts 62 ensures that the register board 44 is properly positioned and oriented in three dimensions, aiding an operator who would manually place such a board into a meter assembly. Furthermore, this arrangement only allows the register board 44 to move axially with the pins 66, as movement in all other directions is mechanically constrained.

In order to retain the register board 44 in its proper position, four snaps 74 are used in conjunction with the aforementioned posts 62. These snaps 74 project out from snap towers 68 that extend from the upper inner cover 40, as seen in FIG. 10. The snap towers 68 are deflected outward during the placement of the register board 44, then retract back onto the register board 44 securing it in place. In this manner, the snaps 74 constrain the register board 44 from possible movement in an axial direction with respect to the locator pins 66. This constraint is further secured since two snap towers 68 are located on a shorter side of the register board 44 and two snap towers 68 are located along longer sides of the register board 44. Thus, the register board 44 is effectively constrained in all three dimensions.

Recall that a register board 44 is assembled first and is attached to a power supply board 46 by a flexstrip cable 58 so that it does not interfere with the placement of the register board to the upper inner cover 40. Consequently, while assembling the register board 44, the snaps 74 are unimpeded to deflect outward. This deflection is brought about by pressing the register board 44 toward its final position, and is accommodated by the sloping edge presented to the register board 44 by the snap feature. Since the power supply board 46 is not present at this stage of assembly, the snap tower 68 is permitted to rotate about its base as the snap 74 is deflected outward. Consequently, locator pins 70 positioned at the end of the snap tower travel much farther than the snaps 74 due to the deflection required to clear the edges of the register board 44. Once the register board 44 clears the edge of the snap 74, the entire tower 68 returns to its natural position retaining the register board 44 in its desired position. Once the register board 44 is in place within the upper inner cover 40, the power supply board 46 is in effect hinged to this general assembly.

Figure 11:
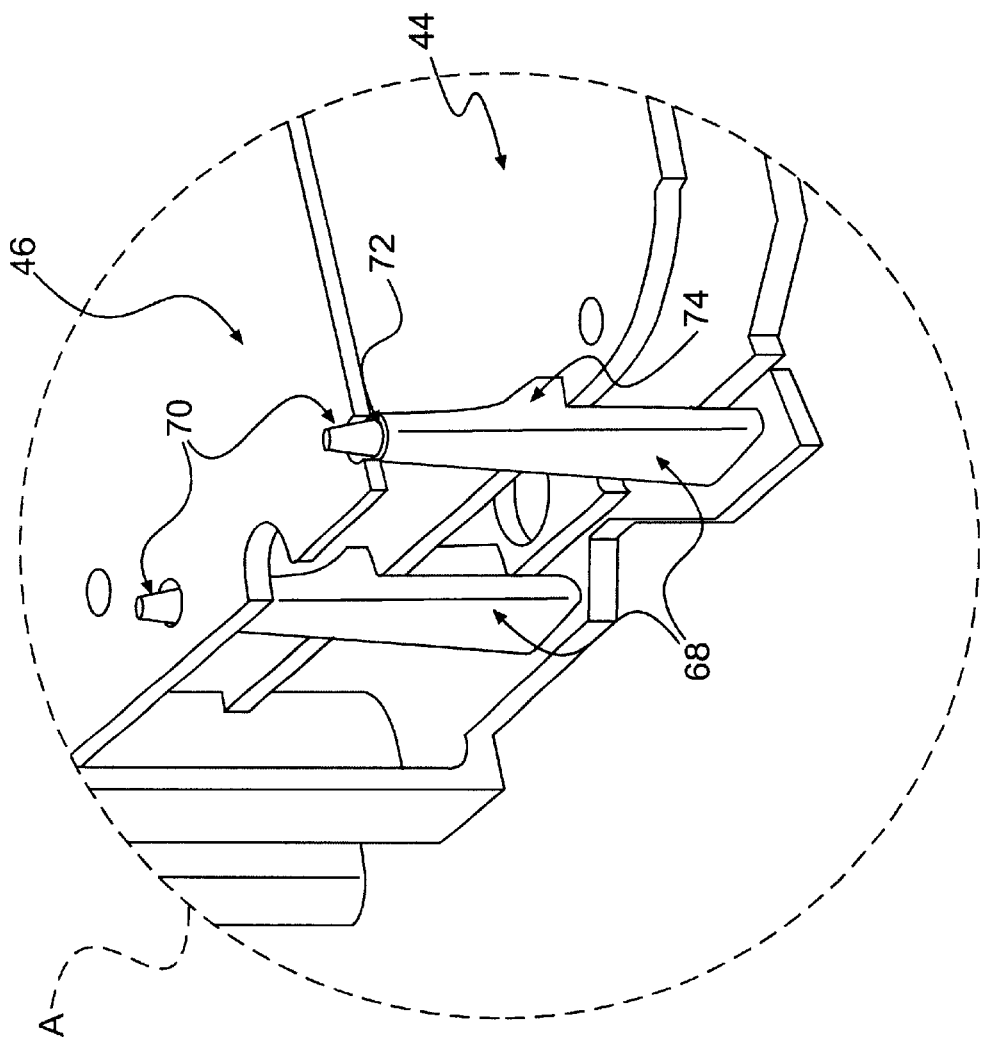
FIG. 11 illustrates a detailed cutaway view (A) of an exemplary snap-tower securing arrangement such as the one depicted in FIG. 10.

Beyond the four snaps 74, each snap tower 68 extends upward so that it terminates as an additional flat and tapered pin combination, as seen in the FIG. 11. FIG. 11 illustrates an exemplary detailed view A of the snap towers 68 interconnecting with a register board 44 and power supply board 46 as expanded from the dotted section A defined in FIG. 10. The tapered snap tower pins 70 serve to facilitate the positioning of the power supply board 46 within the meter assembly. Each snap tower flat 72 serves to maintain a desired parallel distance between the power supply board 46 and register board 44. Additionally, the flat 72 supports the power supply board 46 on the mating side. Once the power supply board 46 is interconnected with snap tower pins 70, the resulting arrangement prevents the snaps 74 from sufficiently deflecting to release the register board 44 from its established position. Thus, the power supply board 46 in its predefined position ultimately captures the register board 44.

Figure 12:
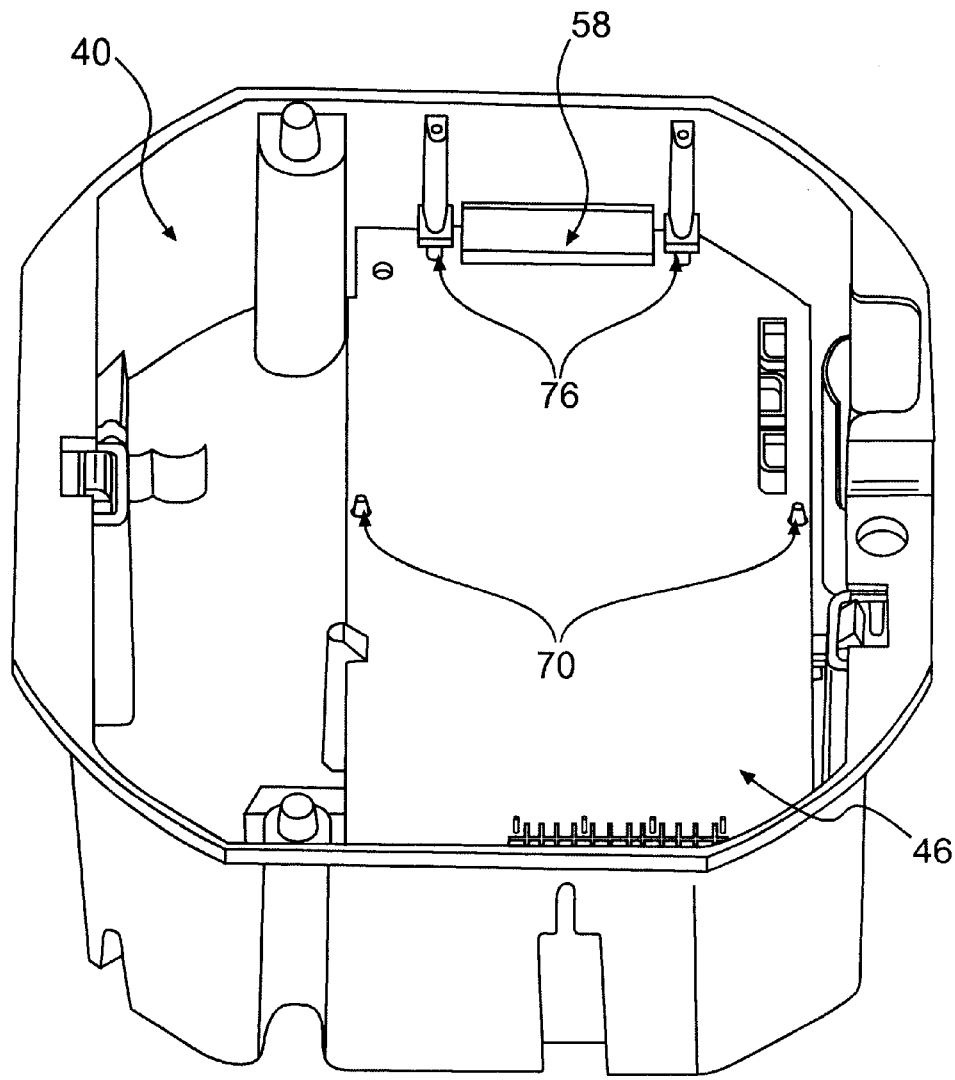
FIG. 12 illustrates a bottom view of an exemplary second circuit board assembled into an exemplary inner casing component.

It is ideal to also prevent the power supply board 46 from movement in the final meter assembly. Thus, an intermediate step in the assembly process is utilized to assist in capturing the power supply board 46. Taking advantage of the hinging effect afforded by the flexstrip connection 58 between circuit boards, a key/slot arrangement 76 is utilized as seen in FIG. 12. Such a key/slot arrangement 76 is designed to facilitate the positioning of the power supply board 46 as well as to partially provide a means to capture the power supply board 46 in the final assembly.

Figure 13:
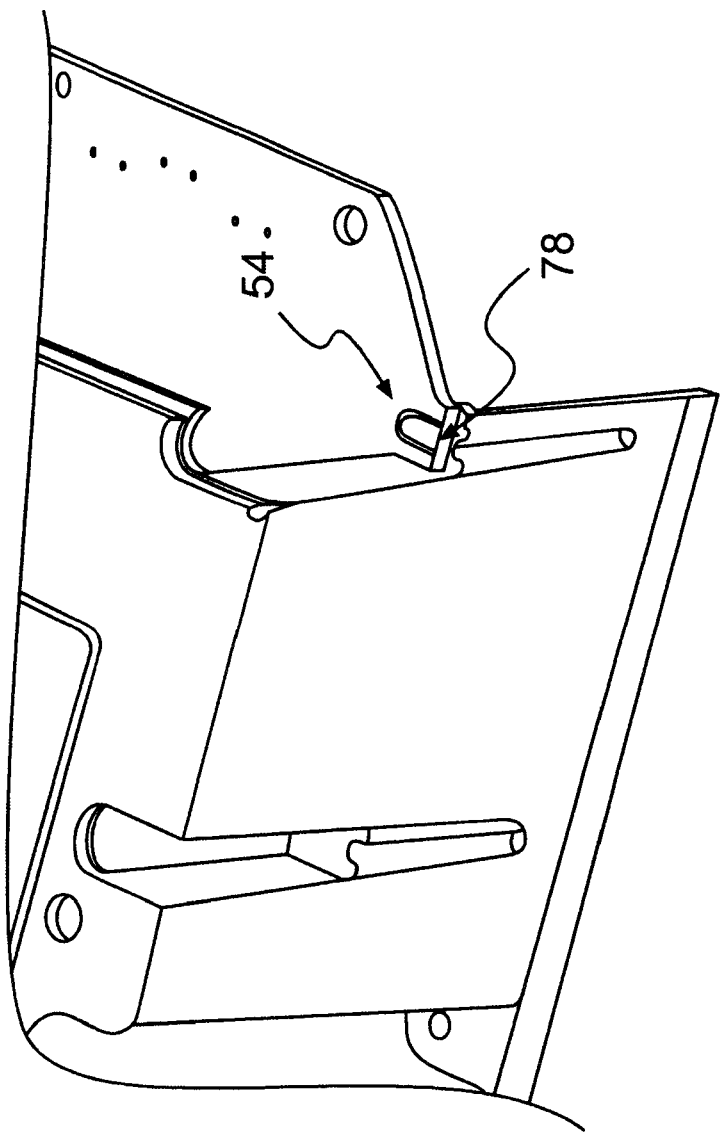
FIG. 13 illustrates a detailed cutaway view of an exemplary means for interconnecting a printed circuit board and an inner casing component.
Figure 14:
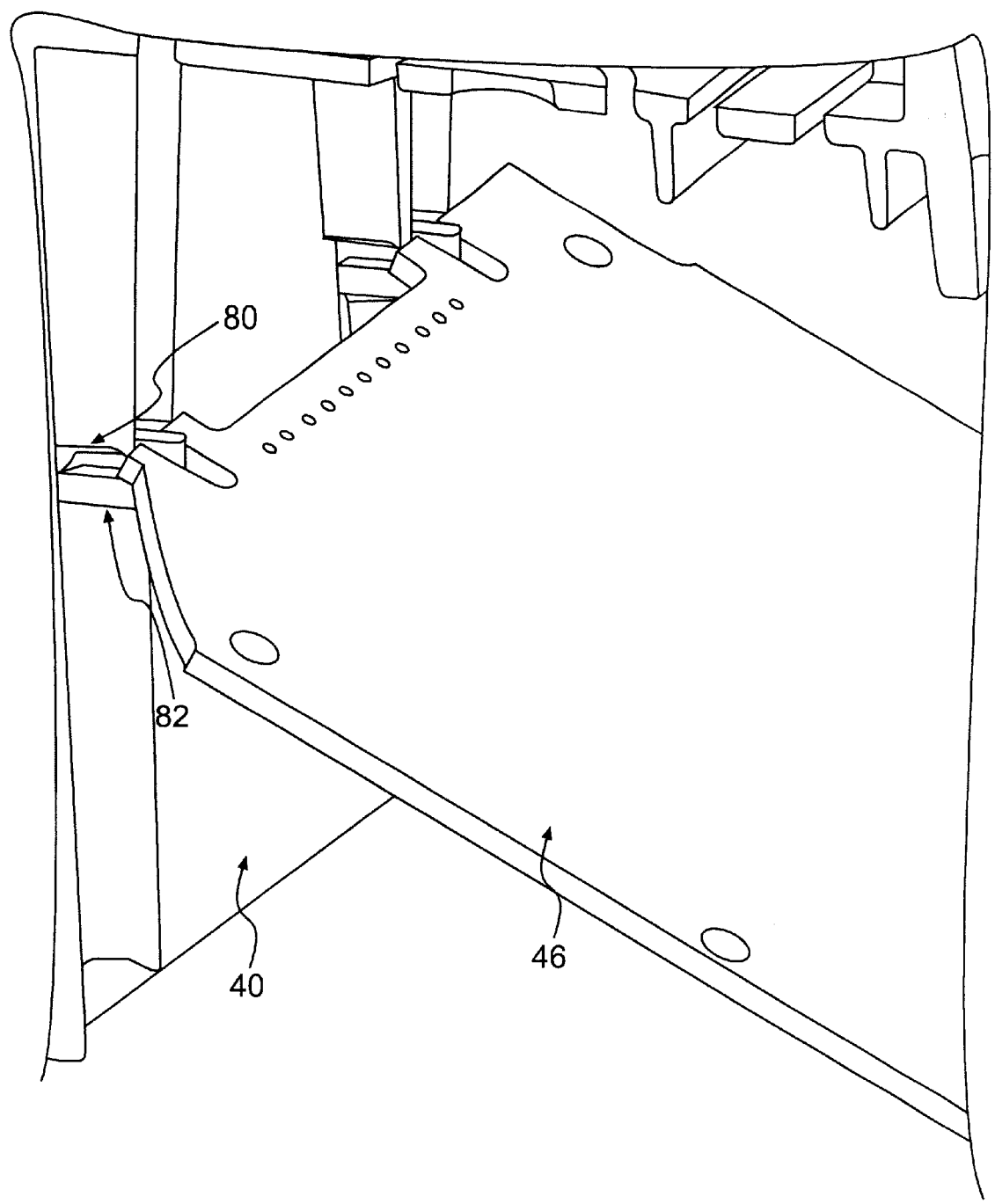
FIG. 14 illustrates an additional detailed view of an exemplary means for interconnecting selected elements of an electric utility meter, as in the means depicted in FIG. 13.

FIG. 13 illustrates a detailed view of an exemplary key-slot interconnection 76 in the final assembled state. Keys 78 are formed into the upper inner cover 40 and slots 54 are formed into the power supply board 46. In addition to the keys 78, there is also a set of parallel flats 80, 82 formed into the upper inner cover 40. The set of flats, shown in FIG. 14, are spaced slightly further apart than the thickness of the power supply board. The combination of keys 78, flats 80, 82 and slots 54 allows the power supply board 46 to be rotated and translated into its predetermined position.

The two flats of FIG. 14 include a rib flat 80 provided by an internal rib feature projecting from the upper inner cover 40 and a tab flat 82 formed by an additional tab extension also projecting from the upper inner cover 40. The flexstrip connection 58 is not shown in FIG. 14 so that the initial engagement of the power supply board slots 54 into the keys 78 of the upper inner cover 40 is clearly displayed. The relative positions and sizes of the flats 80, 82 show that even though the power supply board 46 is significantly rotated as the board is initially positioned, the leading edge of the board is accommodated by the arrangement and guided towards its desired position. This is facilitated by the characteristic spacing between flats and the fact that the tab flat 82 extends further from the inner cover sidewall than the rib flat 80.

Figure 15:
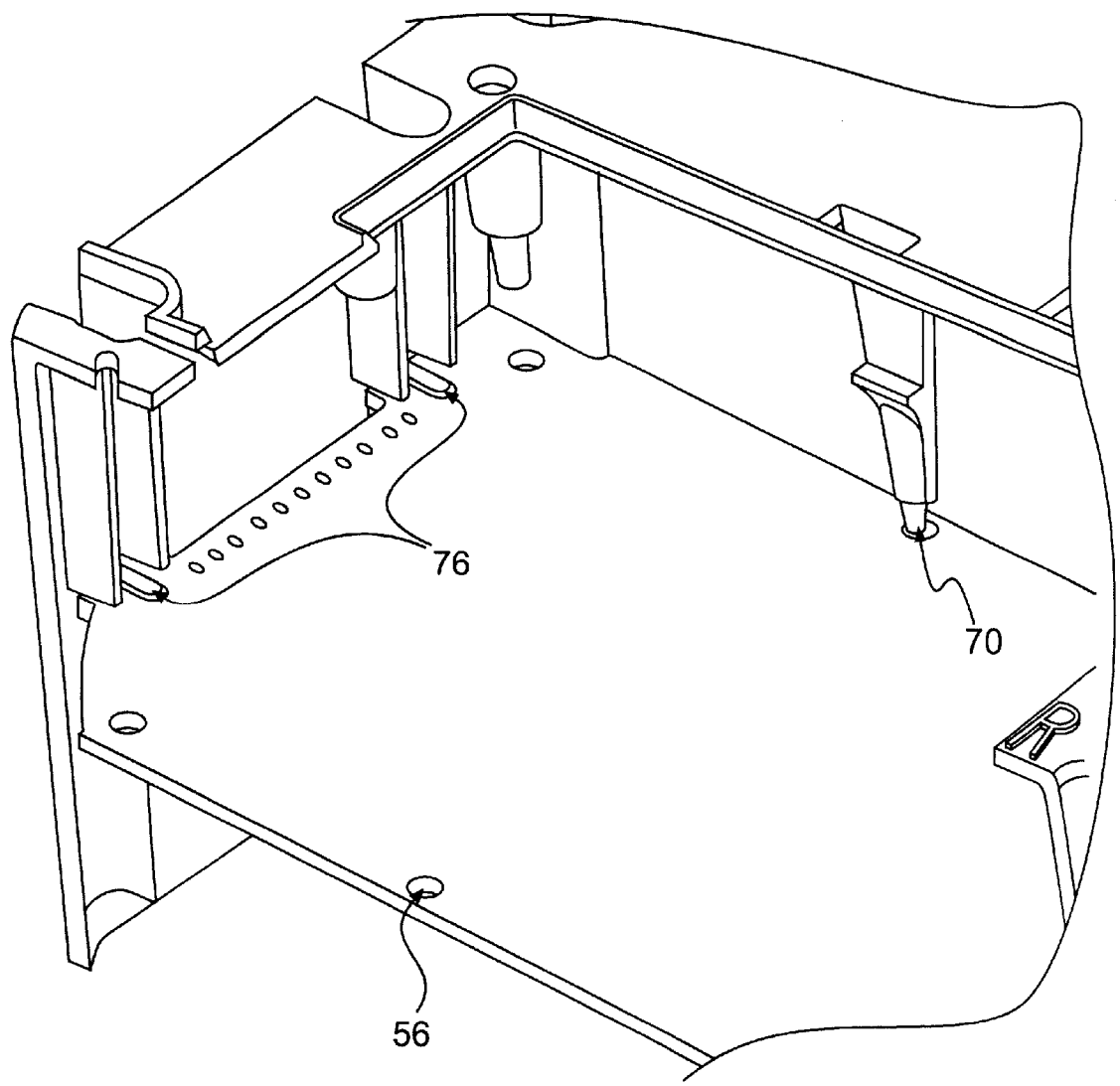
FIG. 15 illustrates the assembled combination of an exemplary second circuit board to an inner casing.

As the board 46 is rotated more toward a parallel orientation with the register board 44, the edge of the power supply board is allowed to more fully engage the key-slot combination 76 as seen in FIG. 15. The pair of keys 78 is designed to bottom out in the slots 54 even though the power supply board 46 is not quite parallel with the register board 44. At this point, the tapered pins 70 of the snap towers 68 have not yet begun to be inserted into the locator holes 56 of the power supply board 46. This feature means that the pins 70 will not interfere with the engagement of the key-slot arrangement during the manual assembly process. However, immediately after the keys 78 are inserted into the slots 54 and the power supply board 46 continues to be rotated toward the final desired position, the tapered pins 70 begin to be inserted into the mating holes 56 of the power supply board 46. There are two sets of pins 70 to be inserted, two on a shorter side of the circuit board and two along a longer side. These two sets of pins 70 vary in height so that only one pair of tapered pins will engage the power supply board 46 at a time. This feature would aid meter assembly processes as two sets of features do not necessarily need to be simultaneously aligned, which can prove difficult in manual assemblies.

The power supply board 46 is constrained on one end by a key/slot combination 76 as it is rotates into its desired position. Accordingly, the board must be allowed to achieve this position. Once this position is attained however, it is ideal to completely constrain the power supply board 46. This constraint is accomplished by a set of snaps 74, an additional key-slot arrangement 76, and a retaining column 90.

Figure 16:
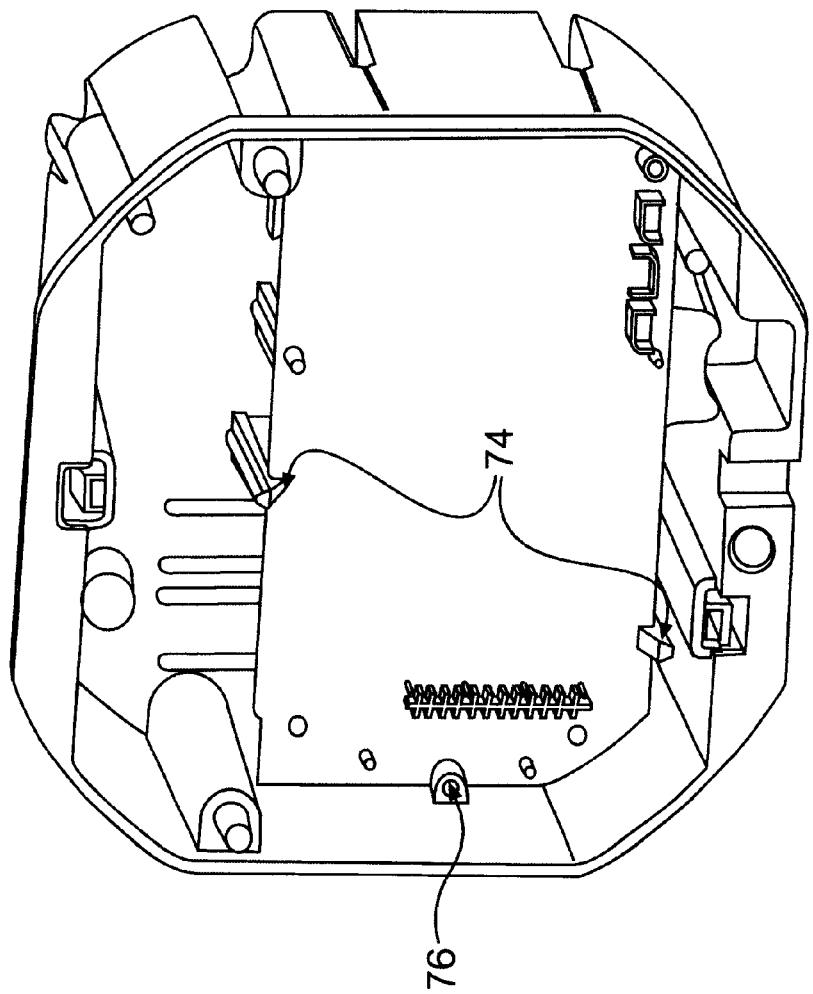
FIG. 16 illustrates additional exemplary features to aid in securing an exemplary second circuit board within an inner component assembly.

FIG. 16 illustrates exemplary snaps 74 and key-slot combinations 76 that help constrain a power supply board 46 within the upper inner cover 40. The snaps 74 are deflected outward as the board 46 is moved into place, with the sloped face of the snaps 74 assisting in such deflection. An additional key/slot configuration 76 is located on the opposite edge from the two initially engaged aforementioned key-slot combinations 76. Once positioned, a surface of the power supply board rests on flats provided by snap towers 68 and three sets of key-slots 76.

Figure 17A:
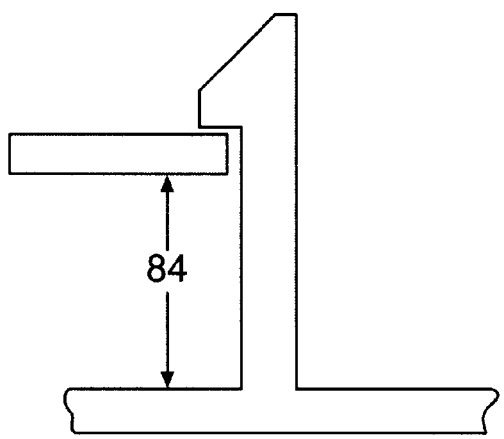
FIGS. 17A and 17B illustrate possible movement of exemplary securement components used in an electric utility meter assembly.
Figure 17B:
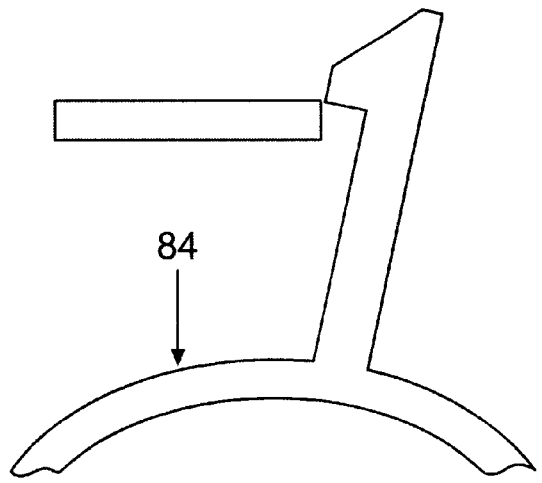

Analysis has shown that for a snap that originates from a flat thin surface 84 as that seen in FIGS. 17A and 17B, a normal force acting on the flat surface 84 of the snap may cause the supporting surface of the snap to bulge as in FIG. 17B. If this occurs, a snap may rotate such that the restrained member is released even though the snap itself suffers very little deflection. Thus, a means to prevent such mechanical failure is incorporated into the features of the subject invention. A small, rounded pin 86 protrudes from the flat contact surface of a snap 74, as depicted in FIG. 18. Both power supply snaps 74 include such a pin 86 that interconnects with mating holes 56 in the power supply board 46.

Figure 19:
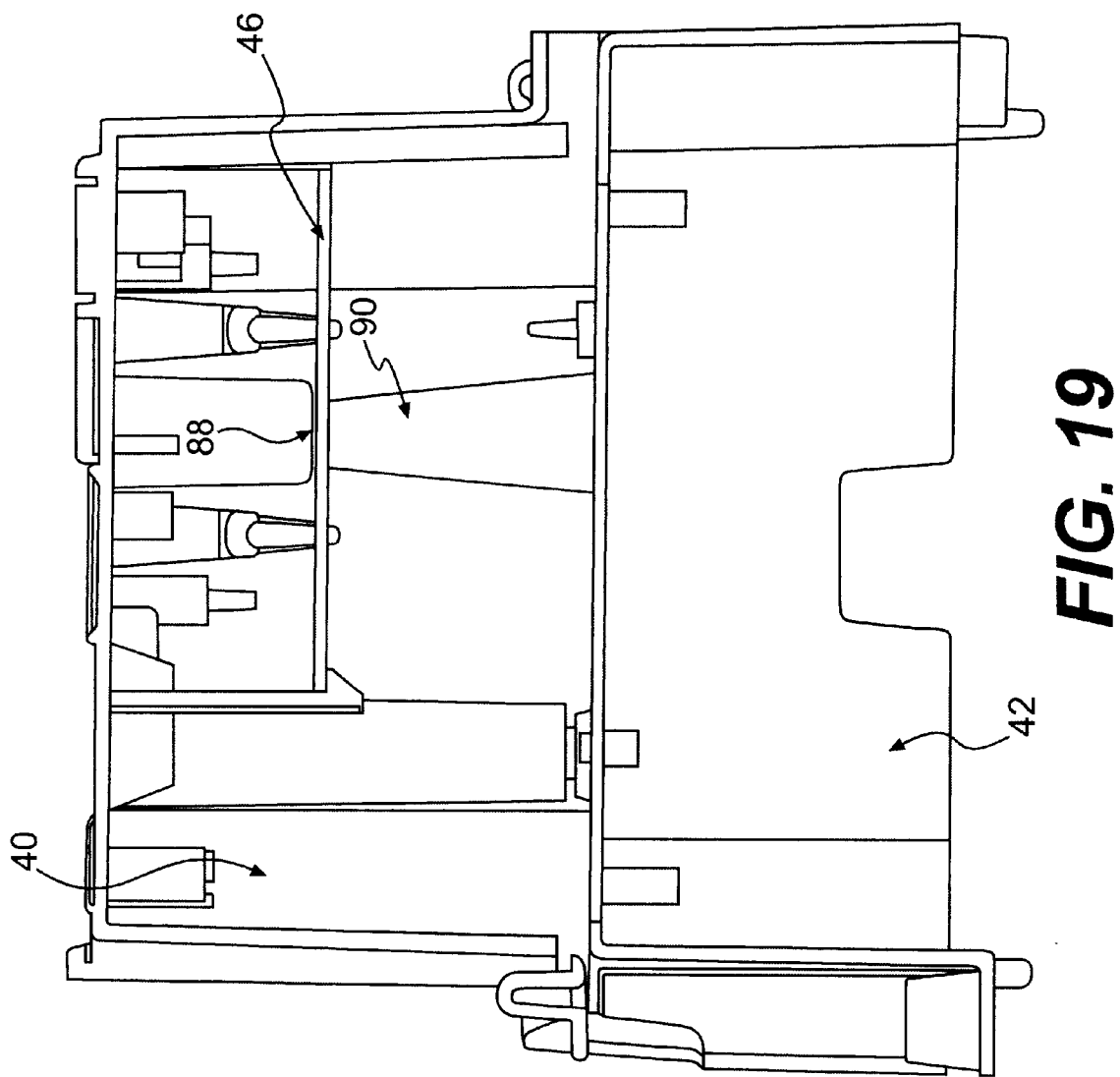
FIG. 19 illustrates a side sectional view of an exemplary inner component assembly including a distinct printed circuit board and two inner casing elements.

To further contain the power supply board 46 in the meter assembly, a retaining column 90 protruding from the lower inner cover 40 is used in conjunction with a flat land 88 on the upper inner cover 40. This conjunction sandwiches the power supply board 46 on the end opposite the first pair of keyslots 76 that are initially engaged while positioning the power supply board. FIG. 19 displays an exemplary illustration of how such a retaining column comes into play as upper and lower inner covers are assembled together. When an upper inner cover 40 is assembled to a lower inner cover 42, the power supply board 46 is captured in between the two covers. The combination of constraint features ensures that the power supply board 46 will remain in its desired location when subjected to a variety of loads.

Figure 20:
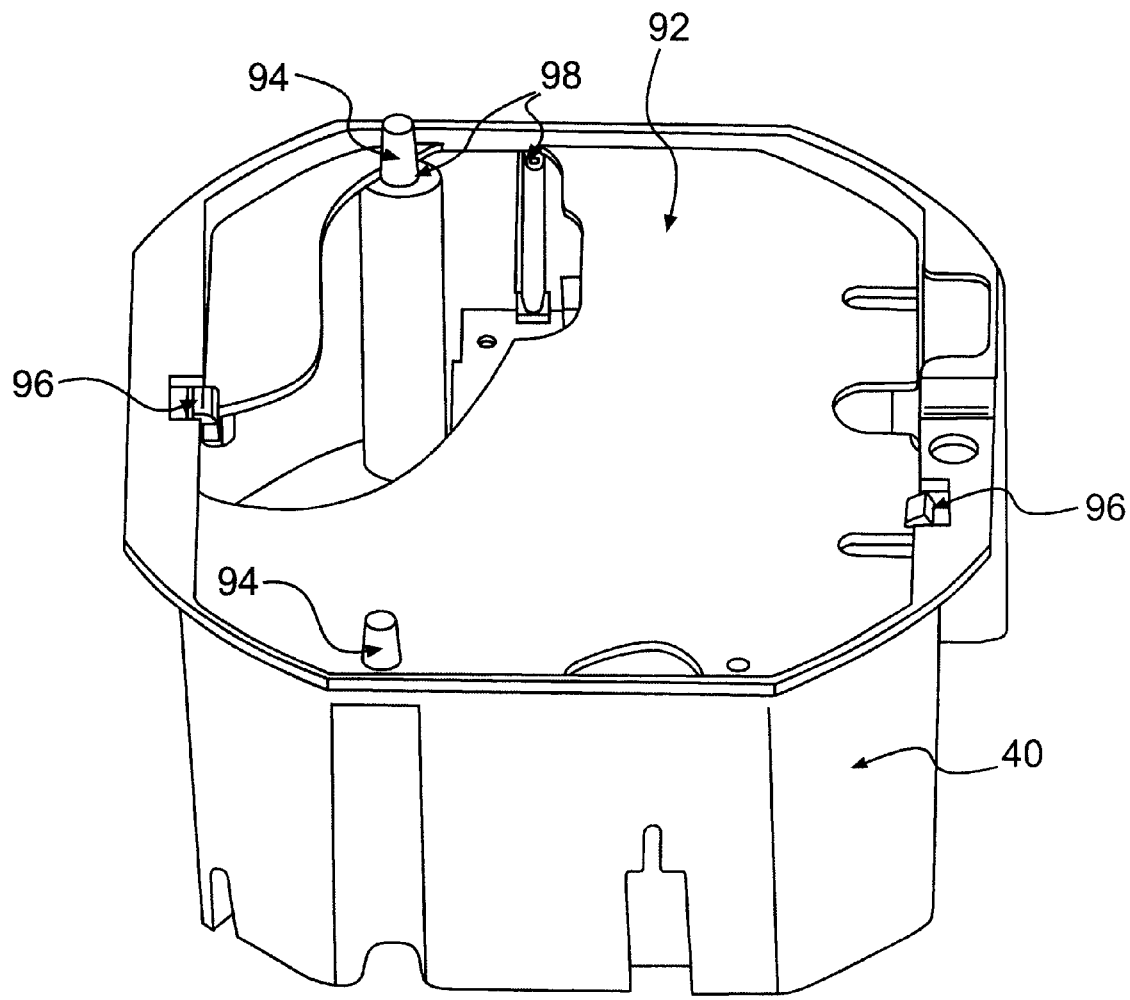
FIG. 20 illustrates a cutaway view of an exemplary optional circuit board in combination with an exemplary inner casing component.

The subject meter assembly includes means to accommodate an additional printed circuit board in addition to the register board 44 and power supply board 46. This means is provided for through specific features built into upper and lower inner covers. As shown in FIG. 20, an option board 92 may reside on several flats 98 that are associated with locator pins 94, additional snaps 96, and edges of ribs extending up from a first set of key-slots 76 that hold a power supply board 46. Mating holes located in the option board 92 are interconnected with locator pins 94 extending from the upper inner cover 40. After the pair of mating holes is engaged, the option board 92 travels axially down the tapered locator pins 94. The option board 92 then engages sloped snap faces, and a downward push on the option board 92 causes the snaps 96 to deflect outward, allowing the edge of the option board 92 to pass by the edge of the snap. Once the edge clears the snap 96, the snap retracts, holding the option board 92 in place for the remainder of the meter assembly.

One of the next steps of the overall meter assembly is connecting the lower inner cover 42 to a baseplate 38. A lower inner cover 42 is typically provided in a lower inner cover assembly as in FIG. 21. Incorporated into the manufactured lower inner cover 42 are four snap-rivets 112 and a hanger 110. These snap-rivets 112 and hanger 110 are removed from the lower cover 42 in the assembly process before the cover 42 is placed over the baseplate assembly. Snap-rivet bosses 108 are located at the base of the lower inner cover 42, through which snap-rivets 112 are passed, securing a lower inner cover 42 into its desired position.

Provisions are also included to securely interconnect an upper inner cover to a lower inner cover. Such provisions offer significant structural integrity for the overall meter assembly and also assist in securing an option board within a meter assembly. The lower cover 42 forms a platform for the upper inner cover 40 to reside with flanges that contain locating holes 104 that mate with respective pins 94 of the upper inner cover 40 during assembly. Locator pin 106 extends from the lower inner cover 42 to mate with respective holes in the upper inner cover. At each of the cover's rounded corners there is a snap 100 that holds the upper inner cover 40 in place as well as raised ribs 102 that locate and constrain the upper inner cover 40. Option board pin 114 helps position and support an option board 92 if used.

Figure 22:
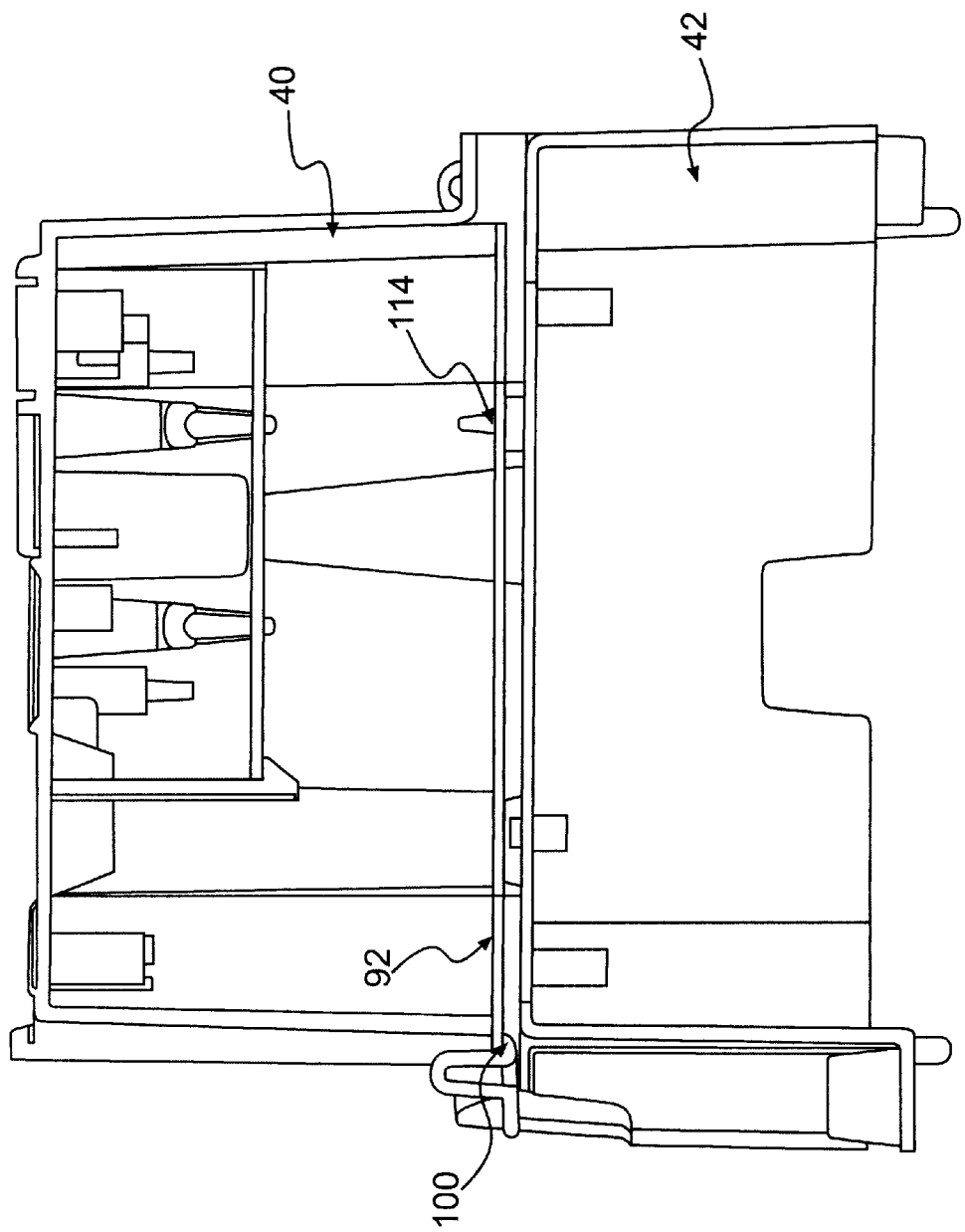
FIG. 22 illustrates a side sectional view of an exemplary inner component assembly including a distinct printed circuit board (unique from the exemplary printed circuit board illustrated in FIG. 19) and two inner casing elements.

Each locator hole 104 on the lower inner cover 42 has a corresponding raised surface, or boss, that surrounds the hole. And each locator pin 94 on the upper inner cover 40 that correspondingly mates with the locator holes 104 of the lower inner cover 42 has a flat associated with it. When an option board 92 is used in a meter assembly, it is sandwiched between the locator hole bosses of a lower inner cover 42 and the locator pin flats of an upper inner cover 40, as seen in FIG. 22. Once the two inner covers are assembled, the option board 92 is held primarily by this sandwiching feature and becomes less dependent on the snaps 96 used to initially secure the option board 92 in the upper inner cover 40. Option board pins 114 with rounded tips and significant taper mate with holes in an option board 92 to help secure the option board 92 within the meter assembly.

A final step in overall assembly of an electric utility meter involves encasing the assembly in an outer cover 36, as shown in FIG. 4. An outer cover 36 includes containment ribs that interconnect with projections extending from the inner covers, including cantilevered springs and snaps. Interconnecting the outer cover 36 with inner covers and encasing the entire meter assembly provides additional overall stability and protection of internal components.

While the invention has been described in detail with respect to specific embodiments thereof, it will be appreciated that those skilled in the art, upon attaining an understanding of the foregoing may readily conceive of alterations to, variations of and equivalents to these embodiments. Accordingly, the scope of established embodiments of the present invention should be assessed as that of the disclosed variation and any equivalents thereto.

What is claimed is:

1. An inner board assembly for use in an electric utility meter, comprising:

a first circuit board for performing predetermined functions of an electric utility meter;

at least a second circuit board for performing additional predetermined functions of an electric utility meter;

a casing for housing and protecting said first and second circuit boards; and a plurality of projections extending from said casing for interconnecting with said first and second circuit boards and for securing said first and second circuit boards within an electric utility meter;

wherein said plurality of projections comprises snap towers configured to position and secure selected of said circuit boards within an electric utility meter, said snap towers being characterized by tapered locator pins and snaps extending from said snap towers.

2. An inner board assembly as in claim 1, wherein said first and second circuit boards include a plurality of respective first and second circuit board openings for mating with selected of said projections, thereby positioning said first and second circuit boards within said inner board assembly.

3. An inner board assembly as in claim 2, wherein said plurality of projections includes mounting posts that have both tapered pins for interconnecting with selected of said first and second circuit board openings, thereby positioning said first and second circuit boards within said inner board assembly in a parallel orientation with one another.

4. An inner board assembly as in claim 3, wherein said mounting posts also include flats which define interconnection limits between said tapered pins and selected of said circuit board openings.

5. An inner board assembly as in claim 2, further including a third circuit board for performing further predetermined functions of an electric utility meter.

6. An inner board assembly as in claim 5, wherein said third circuit board includes a plurality of third circuit board openings for interconnection with additional components of said inner board assembly.

7. An inner board assembly as in claim 6, further including third circuit board securement means for positioning and securing said third circuit board within said inner board assembly.

8. An inner board assembly as in claim 7, wherein said third circuit board securement means comprises tapered locator pins for interconnecting with said third circuit board openings and snaps for securing said third circuit board within said inner board assembly.

9. An inner board assembly as in claim 1, further including a means for connecting said first and second circuit boards.

10. An inner board assembly as in claim 9, wherein said means for connecting is characterized by a plurality of parallel, insulated conductors, for providing a flexible electrical connection between selected electronic components of said first and second circuit boards.

11. An electronic component board assembly for an electric utility meter, comprising:
   a first electronic component board with a first plurality of openings for accommodating interconnection thereto of additional elements of said electronic component board assembly;
   at least a second electronic component board with a second plurality of openings for accommodating interconnection thereto of further elements of said electronic component board assembly;
   means for connecting said first and second electronic component boards;
   an inner casing for housing and protecting said first and second electronic component boards;
   a first plurality of projections extending from said inner casing for interconnecting with said first and second pluralities of openings; and
   a second plurality of projections extending from said inner casing for securing and capturing said electronic component boards within said electric utility meter.

12. An electronic component board assembly as in claim 11, wherein said means for connecting said first and second electronic component boards comprises at least one conductive element encased with a flexible insulating material, for providing an electrical connection between selected electronic components of said first and second electronic component boards.

13. An electronic component board assembly as in claim 11, wherein said first plurality of projections includes tapered locator pins for interconnecting with selected of said first and second pluralities of openings.

14. An electronic component board assembly as in claim 11, wherein said second plurality of projections includes snaps for providing a secure connection between selected of said electronic component boards and said inner casing.

15. An electronic component board assembly as in claim 11, wherein said second plurality of projections includes connector projections for interconnecting with selected of said first and second pluralities of openings and for securing selected of said first and second electronic component boards within said electronic component board assembly.

16. An electronic component board assembly as in claim 11, further including a third electronic component board with a third plurality of openings for accommodating interconnection thereto of further additional elements of said electronic component board assembly.

17. An electronic component board assembly as in claim 16, further including third electronic component board securement means for positioning and securing said third electronic component board within said electronic component board assembly.

18. An electronic component board assembly as in claim 17, wherein said third electronic component board securement means comprises tapered locator pins for interconnecting with selected of said third plurality openings and snaps for securing said third electronic component board within said electronic component board assembly.

19. An inner component assembly for an electric utility meter, comprising:
   a first electronic component board with a first plurality of openings for accommodating interconnection thereto of additional elements of said inner component assembly;
   at least a second electronic component board with a second plurality of openings for accommodating interconnection thereto of additional components of said inner component assembly;
   a connective element for linking said first and second electronic component boards;
   a first inner casing component for housing and protecting said first and second electronic component boards;
   a plurality of board connection projections extending from said first inner casing component for connecting with said first and second electronic component boards, said board connection projections including tapered pins for interconnecting with said first and second pluralities of openings;
   a plurality of board securement projections extending from said first inner casing component for securing and constraining said first and second electronic component boards within said second inner casing component, said board securement projections including snaps for providing snap-fit connections between said first and second electronic component boards and said first inner casing component and keys for providing a key/slot securing arrangement between selected of said electronic component boards and said first inner casing component;
   a second inner casing component for housing and protecting additional elements of an electric utility meter; and a plurality of inner casing projections extending from selected of said inner casing components for mutually interconnecting said inner casing components, said inner casing projections enhancing structural stability of an electric utility meter and further constraining said electronic component boards within said inner component assembly.

20. An inner component assembly as in claim 19, wherein said first plurality of openings comprises mating receptacles for receiving selected of said tapered pins and thus mutually interconnecting said first electronic component board with said first inner casing component.

21. An inner component assembly as in claim 20, wherein said second plurality of openings comprises both slots for mutually connecting with said keys as well as mating receptacles for receiving selected of said tapered pins and thus mutually interconnecting said second electronic component board with said first inner casing component.

22. An inner component assembly as in claim 19, wherein said connective element for linking said first and second electronic component boards is characterized by a plurality of conductive elements provided in a parallel orientation with one another and encased with a flexible insulating material, for providing an electrical connection between selected electronic components of said first and second electronic component boards.

23. An inner component assembly as in claim 19, wherein said inner cover projections include a flat land and retaining column extending from selected of said first and second inner casing components, for constraining selected of said electronic component boards within an electric utility meter.

24. An inner component assembly as in claim 19, further including a third electronic component board with a third plurality of openings for accommodating interconnection thereto of additional components of said inner component assembly.

25. An inner component assembly as in claim 24, wherein said snaps provide a snap-fit connection for each of said first, second and third electronic component boards within said second inner casing component, and wherein said snap-fit connections are ensured against possible snap deflection.

26. An inner component assembly as in claim 24, wherein said third electronic component board is secured within an electric utility meter by being sandwiched between said first and second inner casing components.

27. An inner component assembly as in claim 19, wherein said plurality of inner casing projections includes locator ribs and snaps for providing a secured snap-fit connection between said first and second inner casing components.

28. An electric utility meter, comprising:
a baseplate;
a first inner cover connected to said baseplate for housing and protecting predetermined electronic components for use in said electric utility meter;
a first printed wire board with a first plurality of openings for accommodating interconnection thereto of additional components of said electric utility meter;
a second printed wire board with a second plurality of openings for accommodating interconnection thereto of additional components of said electric utility meter;
a connective element for linking said first and second printed wire boards;
a third printed wire board with a third plurality of openings for accommodating interconnection thereto of additional components of said electric utility meter;
a second inner cover for housing and protecting selected of said printed wire boards;
a plurality of board connection projections extending from said second inner cover for connecting with said printed wire boards, said board connection projections including tapered pins for interconnecting with selected of said first, second and third pluralities of openings;
a plurality of board securement projections extending from said second inner cover for securing and constraining selected of said printed wire boards within said electric utility meter, said board securement projections including snaps for providing snap-fit connections between selected of said printed wire boards and said second inner cover and keys for providing a key/slot securing arrangement between selected of said printed wire boards and said second inner cover;
a plurality of inner cover projections extending from selected of said inner covers for mutually interconnecting said inner covers and for enhancing structural stability of said electric utility meter and further constraining said electronic component boards within said electric utility meter; and
an outer cover, enclosing said first and second inner covers and mutually. interconnecting with at least one of said inner covers.

29. An electric utility meter as in claim 28, wherein said means for connecting said first and second printed wire boards is characterized by a plurality of parallel conductors enclosed in a flexible insulating material, for providing an electrical connection between selected electronic components of said first and second printed wire boards.

30. An electric utility meter as in claim 28, wherein said inner cover projections include a flat land and retaining column extending from selected of said first and second inner covers, for constraining selected of said printed wire boards within said electric utility meter.

31. An electric utility meter as in claim 28, wherein said snaps provide a snap-fit connection for each of said first, second and third printed wire boards within said second inner cover, and wherein said snap-fit connections are ensured against possible snap deflection.

32. An electric utility meter as in claim 30, wherein said third printed wire board is secured within said electric utility meter by being sandwiched between said first and second inner covers.

33. An electric utility meter as in claim 28, wherein said first inner cover is secured to said baseplate by a snap-fit connection provided by a plurality of rivets and corresponding rivet bosses.

34. An electric utility meter as in claims 28, wherein said plurality of inner casing projections includes locator ribs and snaps for provide a secured snap-fit connection between said first and second inner covers.

35. Integrated manufactured structures, said structures including a plurality of components for use in electric utility meter assemblies, comprising:
a lower inner cover assembly, including:
(a) a lower inner cover for housing and protecting predetermined electronic components for use in an electric utility meter, said lower inner cover including a plurality of inner cover openings for securing to and interconnecting with an electric utility meter baseplate;
(b) a plurality of rivets removably connected to said lower inner cover, said rivets providing a means for snap-connecting said lower inner cover and a baseplate together; and
(c) a structure removably connected to said lower inner cover, said structure for mounting a baseplate to a distinct surface; and a component board baseplate assembly, including:
  (a) a plurality of component board baseplates, for placing thereon and soldering to of electronic components, wherein said component board baseplates are for use in at least two electric utility meter assemblies;
  (b) a plurality of scorelines separating adjacent of said component board baseplates, for breaking apart said component board baseplates from other of said component board baseplates; and
  (c) a plurality of openings incorporated into said component board baseplates, for accommodating interconnection thereto of additional elements of an electric utility meter assembly.

36. Integrated manufactured structures as in claim 35, wherein said plurality of component board baseplates includes four baseplates for use in two electric utility meter assemblies.

37. Integrated manufactured structures as in claim 35, wherein said rivets interconnect with selected of said inner cover openings, effectively securing said lower inner cover to an electric utility meter baseplate.

38. A method of assembling the inner components of an electric utility meter, comprising the following steps:
  providing an inner cover to house and protect selected inner components of an electric utility meter, said inner cover including a plurality of inner cover projections for interconnecting with selected of such inner components;
  preparing a first electronic component board, including a first plurality of openings for mating with selected of said inner cover projections;
  preparing at least a second electronic component board, linked to said first electronic component board and including a second plurality of openings for mating with selected of said inner cover projections;
  positioning and securing said first electronic component board into said inner cover; and
  positioning and securing said second electronic component board into said inner cover, oriented generally parallel with said first electronic component board.

39. A method as in claim 38, wherein preparing said first and second electronic component boards includes soldering predetermined electronic components to unpopulated first and second component boards in a single manufacturing step.

40. A method as in claim 39, wherein preparing said first and second electronic component boards includes accordingly programming selected of said electronic components and subsequently testing these components for proper functionality before positioning and securing said first and second electronic component boards into said inner cover.

41. A method as in claim 39, wherein said inner cover projections includes locator pins, snaps and keys.

42. A method as in claim 41, wherein positioning and securing said first electronic component board includes the following sequential steps:
  aligning and interconnecting selected of said locator pins with selected of said first plurality of openings; and
  snap-connecting said first electronic component board within said inner cover.

43. A method as in claim 41, wherein positioning and securing said second electronic component board includes the following sequential steps:
  interconnecting selected of said keys with selected of said second plurality of openings, providing a key/slot arrangement between components;
  aligning and interconnecting selected of said locator pins with selected of said second plurality of openings; and
  snap-connecting said second electronic component board within said inner cover.

44. A method as in claim 38, further including:
  providing an additional inner cover to house and protect additional selected inner components of an electric utility meter;
  providing a third electronic component board; and
  sandwiching said third electronic component board between said inner covers.

45. A method of manufacturing an electronic component board assembly for use in an electric utility meter, comprising the following steps:
  providing an inner casing to house and protect selected components of said electronic component board assembly, wherein said inner casing includes a plurality of projections, including locator pins, keys and snaps;
  providing a pallet of component board baseplates, wherein said pallet further includes scorelines to define distinct component board baseplates and a plurality of baseplate openings to accommodate securement of distinct component boards to said inner casing;
  securing electronic components to said pallet in a predetermined arrangement;
  establishing an electrical connection between selected components of said distinct component board baseplates;
  testing said electronic components to verify proper placement and operation;
  separating said pallet into said distinct baseplates by breaking apart said pallet at said scorelines;
  introducing a selected first of said distinct baseplates into said inner casing;
  positioning and securing said selected first baseplate within said inner casing, wherein positioning and securing said first distinct baseplate includes the following sequential steps:
    (a) aligning and interconnecting selected of said baseplate openings with selected of said locator pins; and
    (b) deflecting selected of said snaps in an outward fashion until they deflect back onto said first distinct baseplate;
  introducing a selected second of said distinct baseplates into said inner casing; and
  positioning and securing said selected second baseplate into said inner casing, wherein positioning and securing said second distinct baseplate includes the following sequential steps:
    (a) interconnecting selected of said keys with selected of said baseplate openings;
    (b) aligning and interconnecting selected of said baseplate openings with selected of said locator pins; and
    (c) deflecting selected of said snaps in an outward fashion until they deflect back onto said second distinct baseplate.

46. Method as in claim 45, wherein securing of said electronic components and creating of said electrical connection is accomplished in a single solder process pass.

47. Method as in claim 45, wherein said electronic components include light emitting diodes (LEDs) and a liquid crystal display (LCD).

48. Method as in claim 47, wherein testing said electronic components includes programming selected of said LED and LCD components as well as subsequently verifying proper operation of said selected LED and LCD components.

49. Method as in claim 45, wherein said locator pins utilized to position and secure said selected second baseplate vary in height to facilitate the aligning and interconnecting step that sequentially follows said step of interconnecting selected of said keys.

50. Method as in claim 45, farther including:
   introducing an additional inner casing to house and protect additional selected components of said electric utility meter;
   introducing an additional component board for performing optional functions for an electric utility meter; and
   postioning and securing said additional component board within said electronic component board assembly.

51. Method as in claim 50, wherein positioning and securing said additional component board involves securing this component board between said inner casings.

52. Method as in claim 51, wherein positioning and securing said additional component board is accomplished with the use of locator pins and snaps extending from selected of said inner casings.

53. A method of manufacturing an electric utility meter, comprising the following steps:
   providing a first inner casing to house and protect selected components of said electronic component board assembly, wherein said first inner casing includes a plurality of projections;
   providing a pallet of component boards, wherein said pallet further includes scorelines to define distinct component boards from other of distinct component boards located on a single given pallet;
   securing electronic components to said pallet in a predetermined arrangement;
   creating an electrical connection between selected components of said distinct component boards of a pallet;
   testing selected of said electronic components to verify proper placement and operation;
   separating said pallet into said distinct component boards by breaking apart said pallet at the predefined scorelines;
   introducing a selected first of said distinct component boards into said first inner casing;
   positioning and securing said selected first component board within said first inner casing;
   introducing a selected second of said distinct component boards into said first inner casing; and
   positioning said selected second component board within said first inner casing in a generally parallel orientation with said selected first component board and securing said selected second component board within said first inner casing.

54. A method as in claim 53, wherein selected of said electronic components include light emitting diodes (LED's) and at least one liquid crystal display (LCD) that are programmed accordingly and subsequently tested for proper functionality before positioning and securing said selected first and second component boards into said first inner casing.

55. A method as in claim 53, wherein positioning and securing said selected first component board includes the following sequential steps:
   (a) aligning and interconnecting selected of said locator pins with selected of said first plurality of openings; and
   (b) snap-connecting said selected first component board within said inner cover.

56. A method as in claim 53, wherein positioning and securing said selected second component board includes the following sequential steps:
   (a) interconnecting selected of said keys with selected of said second plurality of openings, providing a key/slot arrangement between components;
   (b) aligning and interconnecting selected of said locator pins with selected of said second plurality of openings; and
   (c) snap-connecting said selected second component board within said first inner casing.

57. A method as in claim 53, further including:
   providing a second inner casing to house and protect additional selected inner components of an electric utility meter;
   providing a third component board; and
   sandwiching said third component board between said first and second inner casings.

58. A method as in claim 53, further including the following steps:
   providing a second inner casing to house and protect additional selected inner components of an electricity meter; and
   snap-connecting said first inner casing to said second inner casing, effectively forming an inner casing combination.

59. A method as in claim 58, further including the following steps:
   providing a baseplate; and
   snap-connecting selected of said inner casings to said baseplate.

60. A method as in claim 59, further including:
   providing an outer cover; and
   snap-connecting this outer cover over said first and second inner casings, enclosing said inner casing combination and all corresponding electronic components.

* * * * *

UNITED STATES PATENT AND TRADEMARK OFFICE
CERTIFICATE OF CORRECTION

PATENT NO. : 6,528,986 B2
DATED : March 4, 2003
INVENTOR(S) : Henry Ballard

It is certified that error appears in the above-identified patent and that said Letters Patent is hereby corrected as shown below:

<u>Column 14,</u>
Line 56, change "second" to -- first --.

<u>Column 15,</u>
Line 40, change "second" to -- first --.

<u>Column 16,</u>
Line 48, change "claims" to -- claim --.
Line 49, change "casing" to -- cover --.

<u>Column 19,</u>
Line 6, change "farther" to -- further --.

Signed and Sealed this

Ninth Day of March, 2004

JON W. DUDAS
*Acting Director of the United States Patent and Trademark Office*